(12) United States Patent
Yamaguchi et al.

(10) Patent No.: US 6,551,471 B1
(45) Date of Patent: Apr. 22, 2003

(54) IONIZATION FILM-FORMING METHOD AND APPARATUS

(75) Inventors: Hirohito Yamaguchi, Kawasaki; Masahiro Kanai, Tokyo; Atsushi Koike; Katsunori Oya, both of Kawasaki, all of (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/722,675

(22) Filed: Nov. 28, 2000

(30) Foreign Application Priority Data

| Nov. 30, 1999 | (JP) | 11-339241 |
| Apr. 28, 2000 | (JP) | 2000-131042 |
| Jun. 28, 2000 | (JP) | 2000-194476 |
| Jul. 4, 2000 | (JP) | 2000-202225 |
| Aug. 4, 2000 | (JP) | 2000-237317 |
| Aug. 4, 2000 | (JP) | 2000-237318 |

(51) Int. Cl.$^7$ .......................... C23C 14/35; C23C 14/34
(52) U.S. Cl. ....................... 204/192.12; 204/298.06; 204/298.07; 204/298.08; 204/298.09; 204/298.16
(58) Field of Search .................. 204/192.12, 298.06, 204/298.07, 298.09, 298.16, 298.11, 298.08

(56) References Cited

U.S. PATENT DOCUMENTS

| 5,968,327 A | 10/1999 | Kobayashi et al. | 204/298.11 |
| 6,027,825 A | 2/2000 | Shiratori et al. | 428/694 |

FOREIGN PATENT DOCUMENTS

| DE | 1515294 A | 8/1969 | C23C/15/00 |
| EP | 0198459 | 10/1986 | C23C/14/34 |
| EP | 0297502 A2 | 1/1989 | C23C/14/34 |
| EP | 583736 A1 | 2/1994 | C23C/14/00 |
| JP | 6290496 | 10/1994 | G11B/1/10 |
| JP | 10259480 | 9/1998 | C23C/14/46 |
| WO | WO 98/59087 | 12/1998 | C23C/14/04 |

OTHER PUBLICATIONS

English translation of JP 11–158621.*
Schuegraf, K.K., "Handbook of Thin–Film Deposition Processes and Techniques", p. 302 (1988).*
Chakrabarti U.K. et al., "Deposition of Zirconium Boride Thin Films By Direct Current Triode Sputtering" Journal of Vacuum Science and Technology: Part A, American Institute of Physics, vol. 5, No. 2, Mar. 1987, pp.196–201.
Patent Abstracts of Japan, vol. 1999, No. 11, pub. No. 1158621, Jun. 15, 1999.

* cited by examiner

Primary Examiner—Steven H. VerSteeg
(74) Attorney, Agent, or Firm—Fitzpatrick, Cella, Harper & Scinto

(57) ABSTRACT

The present invention provides a film forming method comprising the steps of ionizing sputtering particles and applying a periodically changing voltage to an electrode near a substrate, wherein a time for applying a voltage equal to or higher than an intermediate value between maximum and minimum values of the periodically changing voltage is shorter than a time for applying a voltage equal to or less than the intermediate value, and a film forming apparatus for carrying out the above method.

49 Claims, 18 Drawing Sheets

PRIOR ART

IONIZATION FILM-FORMING METHOD AND APPARATUS

BACKGROUND OF THE INVENTION

1. Field of the Invention

The present invention relates to a film-forming method and apparatus which can be used to produce semiconductor devices, such as LSIs, and recording media, such as magneto-optical disks, and more particularly, to an ionization film-forming method and apparatus which can form various types of deposited films by using ionized particles.

2. Related Background Art

Film-forming methods are used to form wirings and interlayer insulating films on a variety of semiconductor devices or form magnetic and protective layers on recording media. These film-forming methods, which must exhibit various types of performance, have recently been required to provide a film having an improved coverage of an inside of a groove formed in a substrate, especially a bottom of the groove.

FIG. 5 shows a cross section of a film deposited by a conventional sputtering method. The film 102 on the bottom 104 of a groove is by far thinner than the film 100 on a top portion 103 of a substrate 7 outside the groove. This means that the sputtering method provides poor coverage. FIG. 5 also shows that a film is deposited on the side 101 of the groove. Poor coverage and film formation on the side of a groove adversely affect film formation on a substrate.

Below is described a magneto-optical disk of a magnetic domain wall displacement type, which is disclosed in Japanese Patent Application-Open No. 6-290496. Grooves which are concentrically formed in conventional magneto-optical disks and compact disks are not used to record information. However, because information is recorded also on the bottom of a groove in a recording medium of a magnetic domain wall displacement type, a functional film must be formed on the bottom similarly as on the flat parts (hereinafter, referred to as "lands") of the medium outside the groove. In addition, the medium must be adapted so that no magneto-optical signal is produced from the side of the groove, which separates the bottom of the groove and the lands, to prevent interferences between the groove and the lands, to do so, a deposition amount of a film on the side of the groove must be minimized. That is, a recording medium of a magnetic domain wall displacement type requires film formation which is highly directional and has a high bottom coverage ration. The bottom coverage ratio is defined as the ration of a film formation rate on the bottom surface of the groove to a film formation rate on a surface outside the groove. The bottom coverage ratio can be obtained by the formula $t_A/t_B \times 100$ (%), wherein $t_A$ is the thickness of a film formed on the bottom surface of a groove and $t_B$ is the thickness of a film formed on surface outside the groove (see FIG. 4).

Conventional film forming methods which provide a high bottom coverage ratio include the low-pressure remote sputtering method, collimate sputtering method, and a high-frequency plasma assisted sputtering method which is disclosed in Japanese Patent Application Laid-Open No. 10-259480.

The low-pressure remote sputtering method allows sputtering particles to fly straight without scattering because the method uses a lower pressure and a longer mean free path than ordinary sputtering methods. The low-pressure remote sputtering method is also adapted to provide a longer distance between a target and a substrate and make particles fly at a right angle to the substrate.

The collimate sputtering method makes only sputtering particles flying at a right angle to a substrate to reach it and deposits the particles thereon by placing a cylinder having a plurality of holes made at a right angle to the substrate between a target and the substrate.

The high-frequency plasma assisted sputtering method allows flying sputtering particles to deposite by ionizing them in a space of plasma, which is produced near a substrate by applying a high-frequency voltage to the substrate, and directing the ionized sputtering particles at a right angle to the substrate, using a negative voltage (self bias) produced on the substrate due to plasma.

However, the low-pressure remote sputtering method is said to be limited to substrates with a groove aspect ratio up to about 4 in mass production because of its low film formation rate and low raw-material (target) use efficiency due to the long distance between the target and substrate.

The collimate sputtering method has a problem of low film formation rate and low raw-material use efficiency due to a loss caused by sputtering particles deposited on the collimator, and is limited to substrates with a groove aspect ratio up to about 3.

The high-frequency plasma assisted sputtering method can be used for substrates with a groove aspect ratio of 4 or more. However, the sputtering method allows charged particles in plasma to penetrate a substrate, thus heating it because plasma is produced by applying a high-frequency voltage to the substrate. Thus in the sputtering method, it is difficult to form a film on a substrate made of a material which has low heat resistance, such as resin used as the substrate material for recording media, including compact disks and magneto-optical disks.

SUMMARY OF THE INVENTION

It is an object of the present invention, intended to solve the above-described problems, to provide a film forming method and film forming apparatus which can be used to form a film at a high bottom coverage ratio even on a substrate with deep grooves on its surface.

It is another object of the present invention to provide a film forming method and a film forming apparatus which can prevent substrate temperature from increasing.

It is still another object of the present invention to provide an ionization film forming method and an ionization film forming apparatus which promote discharge gas excitation and ionization, thereby increasing the efficiency of ionization of evaporated particles.

These objects are attained by a method for forming a deposited film by sputtering, comprising the steps of:

ionizing sputtering particles and applying a periodically changing voltage to an electrode provided near a substrate, wherein a time for which a voltage equal to or larger than an intermediate value between maximum and minimum values of the above-described voltage is applied is shorter than a time for which a voltage equal to or smaller than the intermediate value is applied.

The objects are also attained by an ionization sputtering apparatus for forming a deposited film by directing sputtering particles to a substrate using an electric field produced near the substrate, comprising:

a sputtering chamber with an evacuating system;

gas introducing means for introducing a processing gas into the sputtering chamber;

a target placed in the sputtering chamber;

ionizing means provided between the target and the substrate;

an electrode disposed near the substrate; and voltage applying means for applying a periodically changing voltage to the electrode under such a condition that the time for which a voltage equal to or larger than an intermediate value between maximum and minimum values of the applied voltage is applied is shorter than the time for which a voltage equal to or smaller than the intermediate value is applied. Detailed descriptions will be given later with reference to examples.

DETAILED DESCRIPTION OF THE PREFERRED EMBODIMENTS

Figure 1:
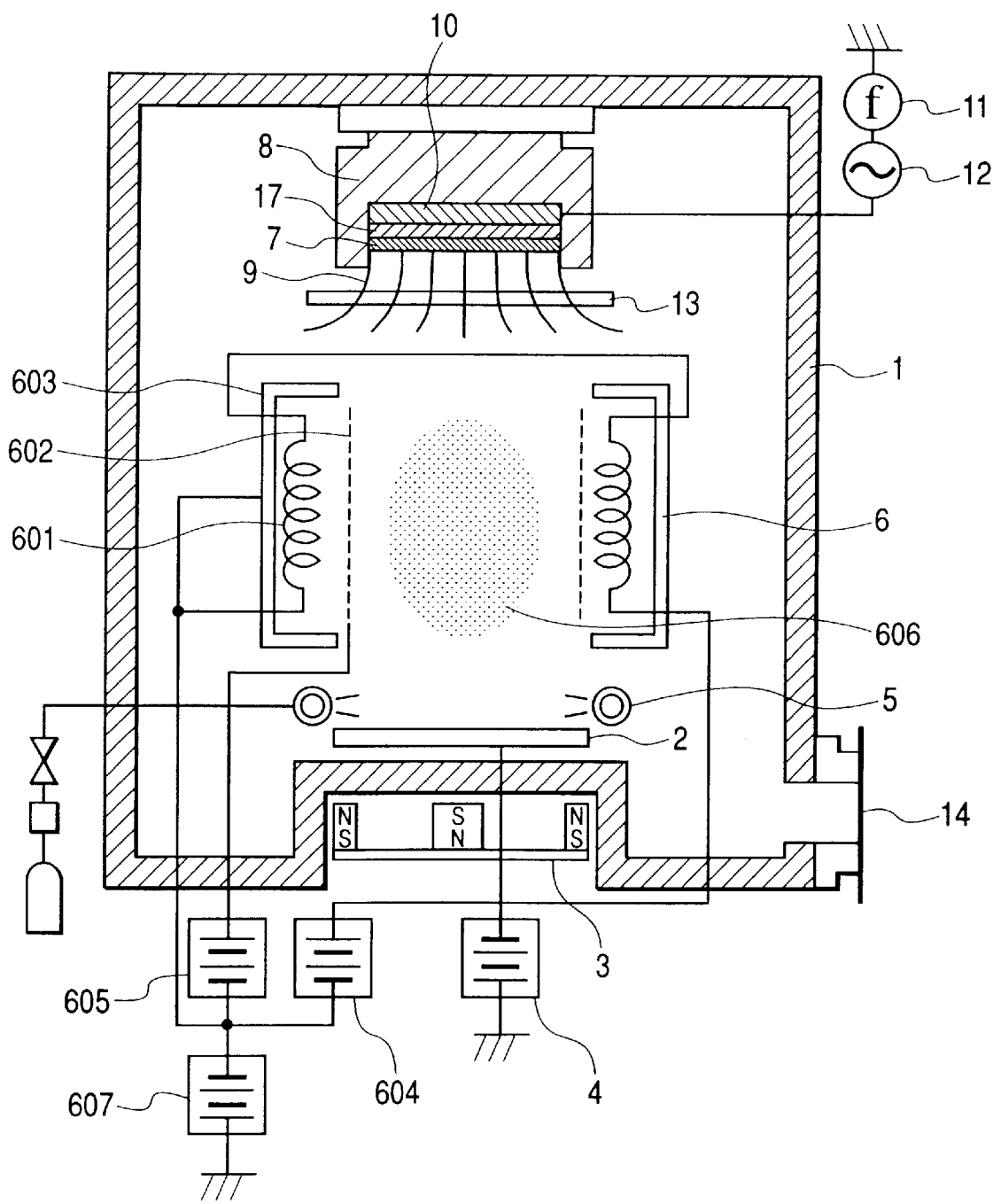
FIG. 1 is a schematic sectional view illustrating a structure of a film forming apparatus according to an embodiment of the present invention.

Referring now to the drawings, the present invention will be described below.

FIG. 1 is a schematic view illustrating an ionization film-forming apparatus according to an embodiment of the present invention. In FIG. 1, a reference numeral 10 indicates an electrode on the back side of a substrate, and reference numerals 11 and 12 indicate voltage applying means for applying a periodically changing voltage to the electrode 10.

According to a film forming mechanism of the present invention, particles evaporated from a target 2 are ionized using an ionizing mechanism 6, and the ionized sputtering particles with directivity are incident on a substrate 7 under the action of an electric field 9 on the substrate 7.

A film forming chamber 1, which is a metal container made of stainless steel, aluminum, or the like, is grounded to be at a reference electric potential and is kept airtight by a gate valve not shown.

An evacuating system 14 is a complex evacuator which can evacuate in a range of the atmospheric pressure to about $10^{-6}$ Pa. The evacuation speed of the evacuating system can be adjusted using an evacuation speed adjuster, not shown, such as an orifice or a conductance valve.

For the embodiment, the target 2 is a disk 3 mm thick and about 3 inches (76.2 mm) in diameter, which is installed through a backing plate and an insulator in a sputtering chamber 1. A mechanism may be provided which cools the target as required, using a refrigerant, such as water.

A magnet 3 as magnetic-field producing means is installed on the back side of the target 2 so that imagnetron sputtering can be carried out.

A sputtering power supply 4, which feeds a predetermined electric power to the target 2 to cause glow discharge, is adapted to apply to the target 2 a negative DC voltage of −200 V or −600 V with respect to the reference voltage.

Processing gas introducing means 5 introduces a sputtering discharge gas, such as a rare gas. Because the gas is efficiently ionized, it is preferable that the processing gas be introduced at the center of an ionizing space. A circular pipe with many gas blow-out holes formed on its center side is more preferably used because the gas is uniformly introduced.

The ionizing mechanism 6, which is of a hot cathode type using Penning ionization, ionizes sputtering ions by hitting thermoelectrons, emitted from a hot cathode, against sputtering particles and sputtering discharge gas particles in an ionizing space 606 provided in a sputtering particle travel path from the target 2 to the substrate 7 or produces sputtering discharge gas excitation seeds and ions. Discharge gas excitation seeds and ions also collide with sputtering particles in the ionizing space to ionize the sputtering particles. As described above, sputtering particles are ionized mainly through the two mechanisms.

Figure 2:
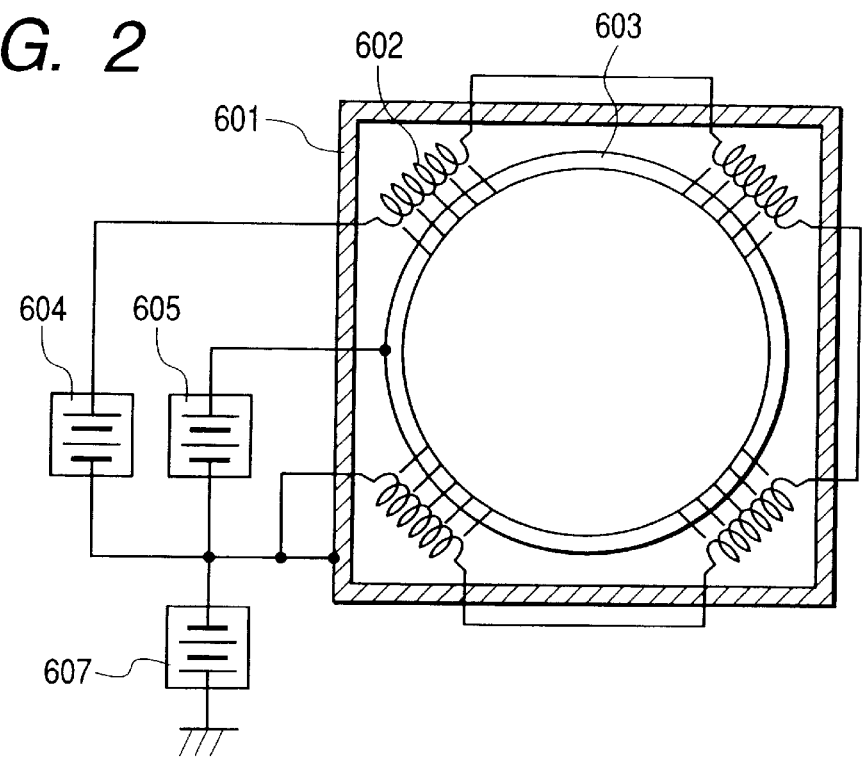
FIG. 2 is a schematic sectional view illustrating an embodiment of an ionizing mechanism of the present invention.

FIG. 2 shows the structure of the ionizing; mechanism 6. Specifically, by feeding current from a DC power supply 604 to a filament 601 connected thereto in series, the ionizing mechanism 6 heats the filament 601, thereby making it emit thermoelectrons. A grid 602 has a network structure. A DC power supply 605 applies a positive voltage thereto, so that thermoelectrons from the filament 601 are accelerated toward the grid 602. The thermoelectrons accelerated are not immediately captured by the grid 602 but travels through the grid 602 the ionizing space 606 in the travel path of sputtering particles. The thermoelectrons collide with sputtering particles and sputtering discharge gas particles to ionize or excite these particles and then are captured by the grid 602. The filament 601 is made of a material with a large coefficient of thermoelectron emission, such as ReW or W, and the grid 602 has a network structure, consisting of wires, for example, 1 mm in diameter which are spaced about 3 mm apart from each other. For the ionizing mechanism, one side of the filament 601 is at the same potential as a casing 603. Thus a DC voltage which is negative with respect to a reference voltage may be applied to the casing 603 by a DC power supply 607 to prevent electron diffusion, or the casing 603 may be kept at the reference potential.

A substrate holder 8, disposed in the chamber 1, is adapted so that the holder can keep the substrate 7 parallel to the target 2. An insulator 17 is interposed between the substrate holder 8 and the substrate 7. The electrode 10 is preferably installed in parallel with the substrate 7.

The electrode 10 is connected with voltage applying means consisting of a function synthesizer 11, serving as a signal generator, and a power amplifier 12. The voltage applying means applies periodically changing voltage to the electrode 10.

Figure 3:
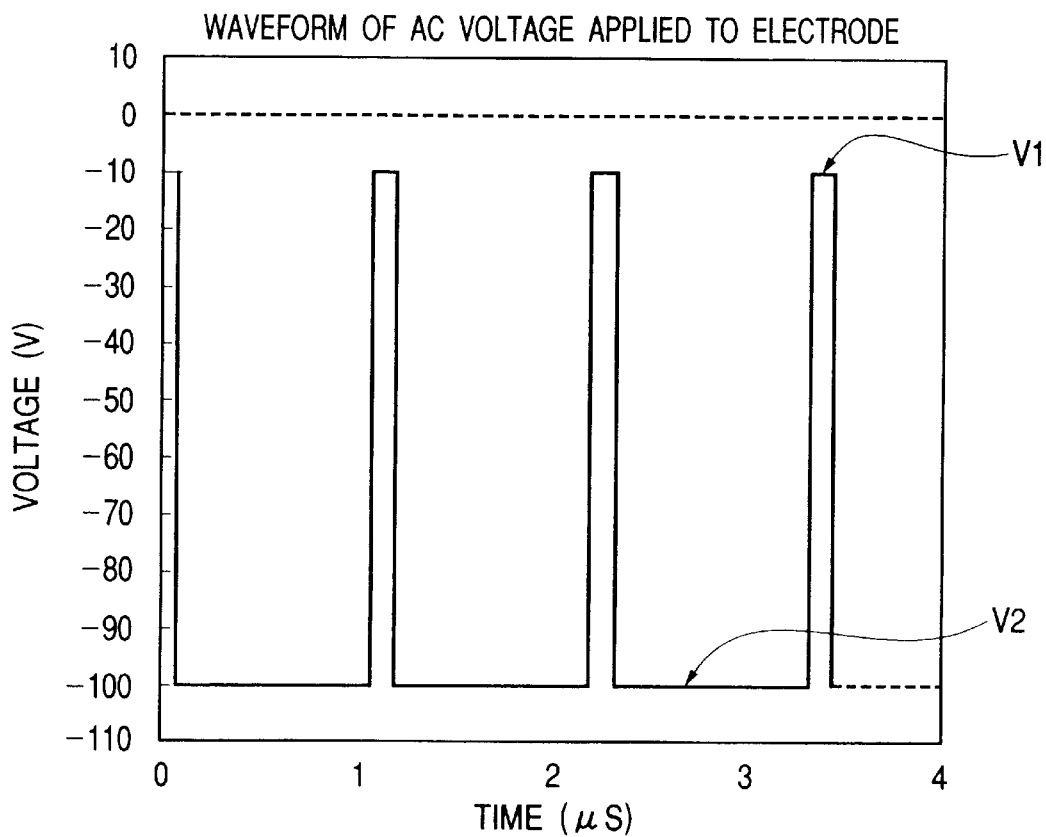
FIG. 3 shows a waveform of a voltage applied to an electrode 10 according to the present invention.
Figure 4:
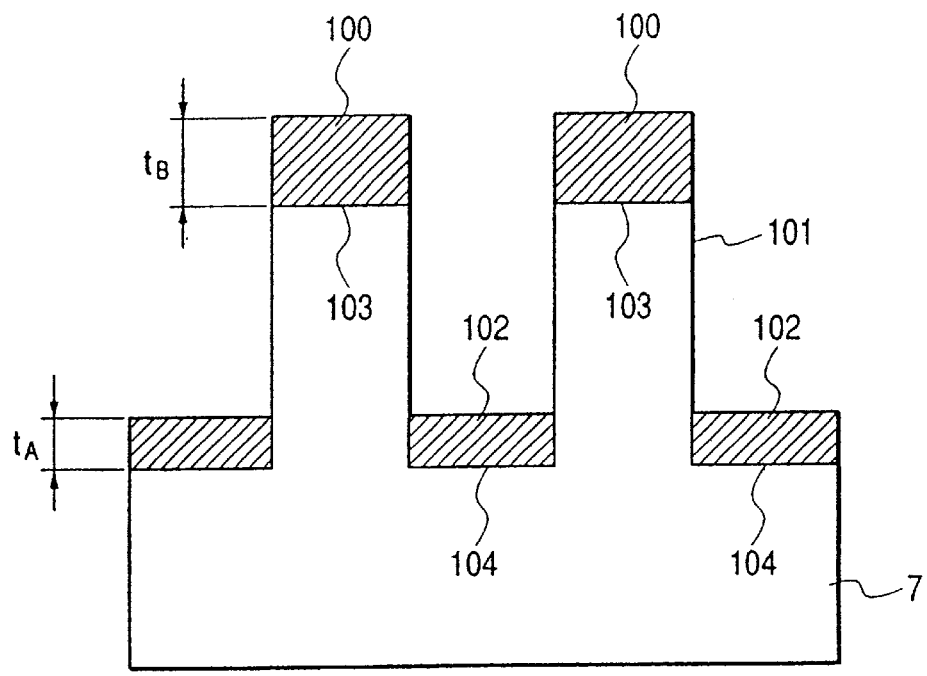
FIG. 4 is a schematic view illustrating a method for calculating a bottom coverage ratio according to the present invention.
Figure 5:
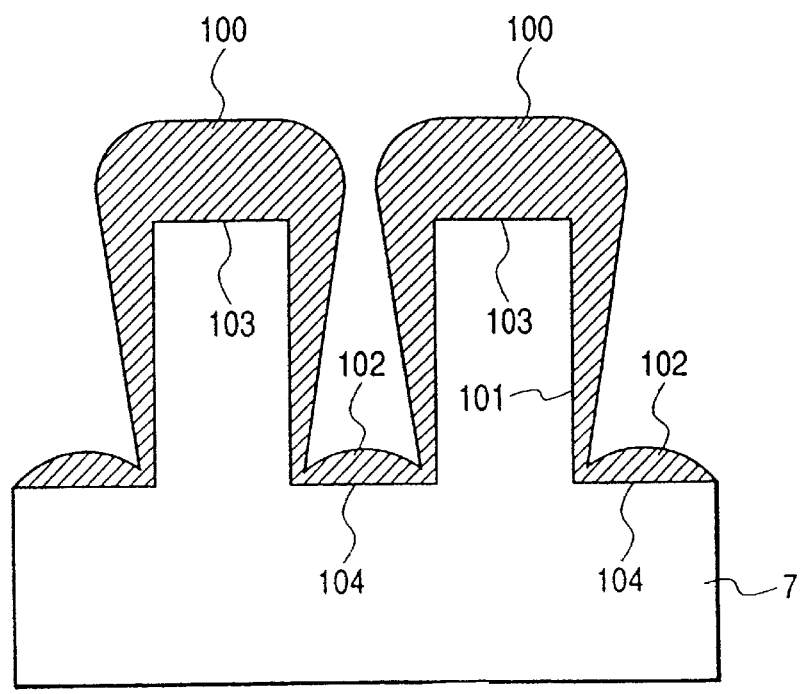
FIG. 5 is a sectional view of a film deposited by a conventional sputtering method.

FIG. 3 exemplifies a bias voltage applied to the electrode 10. The bias voltage varies in a predetermined period between a maximum voltage V1 (a voltage at which the amplitude takes a minimum with respect to a floating potential) and a minimum voltage V2 (a voltage at which the amplitude takes maximum with respect to a floating potential). The floating potential is a potential which an electrically insulated substrate placed in plasma generates under the action of plasma. In this embodiment, the floating potential is a potential generated at the substrate 7 when no voltage is applied to the electrode 10.

Such a bias voltage produces an electric field 9 near the substrate 7 substantially at a right angle to the substrate 7, so that ionized sputtering particles are accelerated along the electric field 9 to reach the substrate 7. Because ionized particles are incident on the substrate 7 in the direction of the electric field 9, it is desirable that the electric field 9 be uniformly formed over the substrate as directed at a right angle to the substrate as possible. Any waveform and voltage can be applied from the signal generator 11 and power amplifier 12 to the electrode 10.

An ionization film-forming method according to an embodiment of the present invention will be described below.

After the substrate 7 is installed in the substrate holder 8, the chamber is evacuated to about $10^{-6}$ Pa using the complex evacuating system 14. Then the ionizing mechanism 6 is operated. That is, first, the DC power supply 607 is operated and set to a value. Next, the filament DC power supply 604 is operated to heat the filament 601 by energizing it. Finally, using the grid DC power supply 605, a positive DC voltage of about +10 to about +200 V is applied to the grid 602 to cause it to emit thermoelectrons in the ionizing space 606.

Depending on the rate of film formation by sputtering, it is desirable that the value of a current (emission current) flowing into the grid 602 be set to 5 A or more during film formation.

Then using the processing gas introducing means 5, a sputtering gas such as Ar is introduced, and the evacuation speed adjuster for the complex evacuating system 14 is controlled to keep the chamber 1 at 0.2 to 2.5 Pa. Next, by operating the sputtering power supply 4, sputtering discharge is performed to start sputtering. At the same time, by operating the signal generator 11 and the power amplifier 12, a periodically changing voltage is applied to the electrode 10 to produce the electric field 9 substantially perpendicular to the surface of the substrate 7.

For example, a voltage which has the rectangular waveform in FIG. 3 is applied to the electrode 10 as described above so that electrons can be incident on the substrate at the maximum voltage V1 near the rectangular-wave floating potential. Specifically, it is desirable that the maximum voltage V1 be chosen within the range of 0 to −10 V because the floating potential is often within or around the range. Depending on sputtering conditions, the floating potential may be more than −0 V. In this case, the maximum voltage V1 should be chosen according to the floating potential. As described above, as a voltage applied near the substrate 7, which is determined on basis of the maximum voltage V1 around the floating potential or above it is applied so that electrons can be incident on the substrate, and the minimum voltage V2 is applied so that positive ions can be incident on the substrate. In addition, to prevent a film formation rate from significantly decreasing under the effect of reverse sputtering, it is desirable that the minimum voltage V2 be set to −20 to −100 V.

To make ions efficiently incident on the substrate while preventing substrate charge-up, it is desirable that the frequency be 100 kHz or more and that the waveform duty ratio be set to 1:50 or more, that is, the ratio of the time for which the maximum voltage V1 is applied to the time for which the minimum voltage V2 is applied be set to 1/50 or less.

After presputtering is performed for a few minutes, with the conditions unchanged, a substrate shutter 13 is opened to start film formation. Particles sputtered by sputtering discharge are ionized in the ionizing space 606, directed to the substrate 7, and accelerated under the action of the electric field 9 near the substrate 7, so that the particles are attracted to the substrate 7 and deposited efficiently on the bottoms of grooves in the substrate.

After a film with a predetermined thickness is formed, the shutter 13 is closed, and the signal generator 11, power amplifier 12, sputtering power supply 4, and processing gas introducing means 5 are first stopped and then the filament power supply 604, grid power supply 605, and floating power supply 607 in the ionizing mechanism 6 are stopped. Finally, a gate valve not shown is closed, the sputtering chamber 1 is emptied, and the substrate 7 is removed from the substrate holder 8.

For the ionizing mechanism 6, it is not preferable to deposit sputtering particles on the filament 601. This is because a deposited film on a filament changes its resistance and causes the filament to easily break. To prevent this problem, the filament power supply 604 is desirably kept in service whenever the sputtering power supply 4 is in operation.

In this embodiment described above, various materials for forming a film to be evaporated, including metals, alloys, and compounds, may be used. The embodiment uses a mechanism which hits thermoelectrons against evaporated particles and discharge gas particles to ionize the evaporated particles. According to the ionization film-forming method of the present invention, however, various ionizing means, such as laser assisted ionization and high-frequency coil plasma assisted ionization methods, which can ionize the evaporated particles between the evaporation source and the substrate, can be used.

By taking examples, the present invention will be more specifically described below. Although the following examples are typical of the best embodiments of the present invention, the examples do not limit the present invention.

EXAMPLE 1

Following the procedures for the above-described embodiment, a film was formed under conditions given below.

Material for the target 2: GdFeCr (ternary alloy)
Power fed to the target 2: 400 W
Pressure in the sputtering chamber: 0.8 Pa
Discharge gas: Argon
Discharge gas flow rate: 200 sccm
Ionizing mechanism grid voltage: 50 V
Ionizing mechanism emission current: 20 A
Ionizing mechanism floating power supply voltage: −30 V Under these conditions, with the frequency and duty ratio of a voltage to be applied to the electrode 10 set to 500 kHz and 1:100, films were successively formed on a substrate 7 for five minutes with different minimum and maximum voltages V2 and V1 applied to the electrode 10 to make sample substrates. When they were made, temperature was measured on the surface of the sample substrates. FIG. 1 shows the results. They show that properly setting voltage to be applied to the substrate significantly reduces an increase in substrate temperature.

For example, setting V1 and V2 to −5 to −10 V and −40 to −100 V, respectively allows a film to be formed at about 60° C. as the temperature of the substrate 7. This, in turn, means that a film can smoothly be formed on a substrate made of a material with low heat resistance, such as polycarbonate. For example, polycarbonate, polymethyl metahcrylate, and epoxy resin are said to have a thermal deformation temperature of 95 to 105° C., 120 to 132° C., and about 135° C., respectively. The present example allowed a good film to be formed on substrates made of such materials with low heat resistance.

In the film formation under the conditions of the present example, the floating potential was in a range of 0 to 10 V as described above. From the results of the present example, the maximum voltage V1 was set to a value obtained by subtracting 10 V from the floating potential, thereby obtaining a more suitable result.

EXAMPLE 2

According to Example 1, films were formed on an Si substrate having grooves with a bottom width of 0.25 μm and an aspect ratio of 4 under the following conditions. In the present example, sample substrates were made at different maximum and minimum voltages V1 and V2. The bottom coverage ratio of these sample substrates was measured. Table 2 shows the results.

For information, Table 2 also gives bottom coverage ratios obtained with conventional low-pressure remote sputtering and high-frequency plasma assisted ionization sputtering apparatuses.

For example, conventional low-pressure remote sputtering methods provide a bottom coverage ratio of about 16% while the present example provided a bottom coverage ratio of about 40% especially when a maximum voltage V1 of −10 V and a minimum voltage V2 of −40 V were applied to the electrode 10.

In the film formation under the conditions of the present example, the floating potential was in a range of 0 to 10 V as described above. From the results of the present example, the maximum voltage V1 was set to a value obtained by subtracting 10 V from the floating potential, thereby obtaining a more suitable result.

EXAMPLE 3

According to Example 1, films were formed on an Si substrate 7 having grooves with a bottom width of 0.25 μm and an aspect ratio of 4 by applying the maximum voltage V1 of −10 V and minimum voltage V2 of −40 V to the electrode 10 and changing the frequency of the voltaged applied to the electrode 10. The bottom coverage ratio of the obtained samples were measured.

Figure 6:
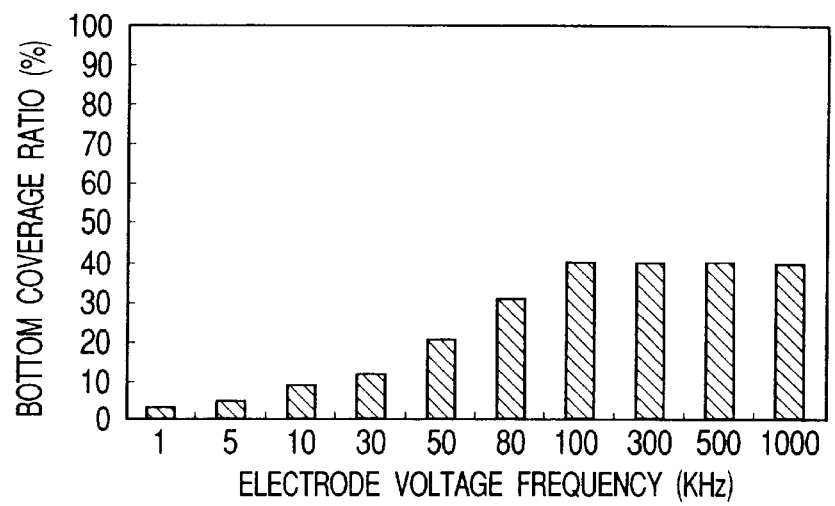
FIG. 6 shows a relationship between a frequency of voltage applied to the electrode 10 and the bottom coverage ratio in Example 3 of the present invention.

FIG. 6 shows the results of the measurements, which indicate that the present example significantly increases the bottom coverage ratio, compared with conventional sputtering methods. For example, conventional low-pressure remote sputtering methods provide a bottom coverage ratio of about 16% while the present example provided a bottom coverage ratio of about 40% especially when the frequency of voltage to be applied to the electrode 10 was set to 100 Hz or more.

In the film formation under the conditions of the present example, the floating potential was in a range of 0 to 10 V as described above. From the results of the present example, the maximum voltage V1 was set to a value obtained by subtracting 10 V from the floating potential, thereby obtaining a more suitable result.

EXAMPLE 4

Figure 7:
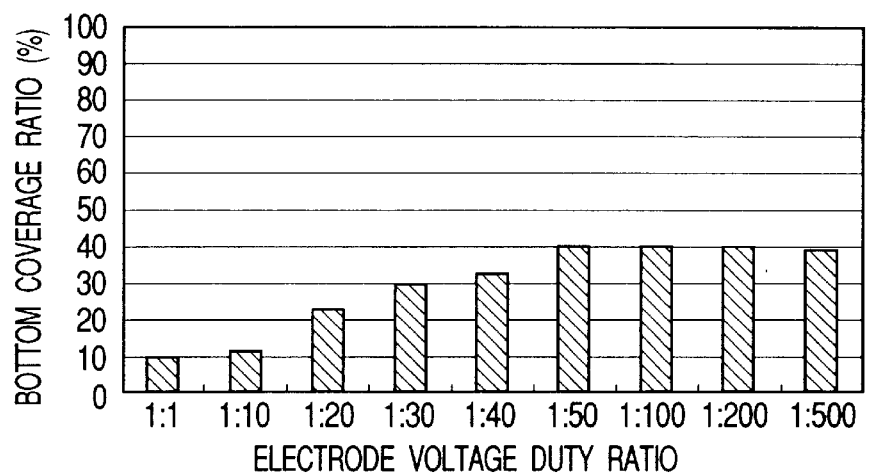
FIG. 7 shows a relationship between a duty ratio of the voltage applied to the electrode 10 (the ratio of a time Ti for which a voltage V1 is applied to a time T2 for which a voltage V2 is applied, as shown in FIG. 3) and the bottom coverage ratio in Example 4 of the present invention.

According to Example 1, films were formed on an Si substrate 7 having grooves with a bottom width of 0.25 μm and an aspect ratio of 4 at different duty ratios (the duty ratio is the ratio of the time Ti for which the maximum voltage V1 is applied to the time for which the minimum voltage V2 is applied) of a voltage applied to the electrode 10, with the maximum voltage V1 and minimum voltage V2 set to −10 V and −40 V, respectively. The bottom coverage ratio of the obtained samples were measured. FIG. 7 shows the results of the measurements, which indicate that the present example significantly increases the bottom coverage ratio, compared with conventional sputtering methods. For example, conventional low-pressure remote sputtering methods provide a bottom coverage ratio of about 16% while the present example provided a bottom coverage ratio of about 40% especially when the duty ratio of the voltage to be applied to the electrode 10, that is, T1/T2 was set to 1/50 or less.

In the film formation under the conditions of the present example, the floating potential was in a range of 0 to 10 V as described above. From the results of the present example, the maximum voltage V1 was set to a value obtained by subtracting 10 V from the floating potential, thereby obtaining a more suitable result.

EXAMPLE 5

According to Example 1, using $SiO_2$ for the target 2 and RF power supply as the sputtering power supply 4, $SiO_2$ film was formed on an Si substrate with grooves, with different maximum and minimum voltages applied to the electrode 10. By reactive ion etching, a plurality of sample Si substrates were provided which had grooves with a bottom width of 0.5 μm and an aspect ratio of 4. In addition, according to Example 1, using GdFeCr for the target 2, GdFeCr films were formed on Si substrates with grooves, with different maximum and minimum voltages applied to the electrode 10. The $SiO_2$ and GdFeCr films were 100 nm and 80 nm thick outside the grooves, respectively. Dielectric strength was measured between the Si substrate and the GdFeCr film formed thereon at the bottom of each sample substrate.

COMPARATIVE EXAMPLE

By sputtering, $SiO_2$ film 20 nm thick and GdFeCr film 80 nm thick were formed on the lands of Si substrates under the same film formation conditions as in Example 5, except that the ionizing mechanism was not operated.

Dielectric strength was measured between the Si layer and the GdFeCr layer on it at the bottom of each sample substrate.

Table 3 gives the dielectric strength of the sample film formed in Example 5 and the dielectric strength of the sample film obtained by conventional sputtering in the comparative example.

Table 3 shows that the dielectric strength is about 2 V in the comparative example while properly choosing the values of V1 and V2 caused the dielectric strength to significantly increase up to 13V in Example 5.

EXAMPLE 6

Figure 8:
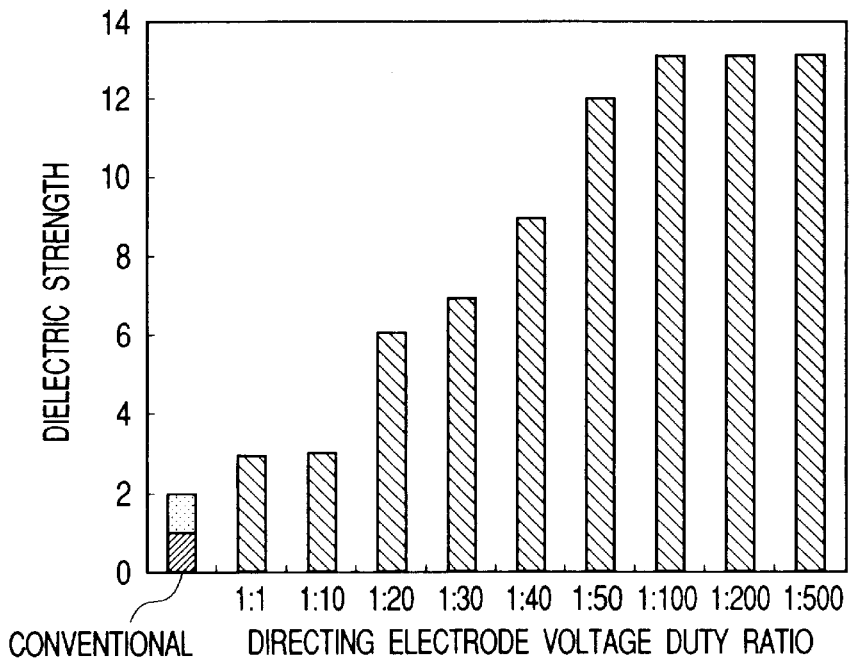
FIG. 8 shows a relationship between the duty ratio of a voltage applied to the electrode 10 and a dielectric strength in Example 6 of the present invention.

According to Example 5, films were formed on a substrate 7 at different duty ratios of voltage applied to the electrode 10, with the maximum voltage V1 and minimum voltage V2 set to −10 V and −40 V, respectively, and the dielectric strength of the obtained samples were measured FIG. 8 shows the results. For comparison purposes, FIG. 8 also shows the dielectric strength of a sample obtained by a conventional sputtering method.

FIG. 8 shows that Example 6 allowed a sample substrate with a significantly increased dielectric strength exceeding 13V to be provided by setting the duty ratio to 1:50 or more.

EXAMPLE 7

According to Example 1, using $SiN_3$ for the target 2 and an RF power supply as the sputtering power supply 4, SiN. films were formed on an Si substrate having grooves with a bottom width of 0.25 μm and an aspect ratio of 4, with different maximum and minimum voltages V1 and V2 applied to the electrode 10. The bottom coverage ratio of the obtained samples were measured. Table 4 shows the results.

The present example allowed the bottom coverage ratio to be markedly increased by properly choosing the values of V1 and V2, thereby providing a sample substrate with a bottom coverage ratio of up to about 33%.

EXAMPLE 8

Figure 9:
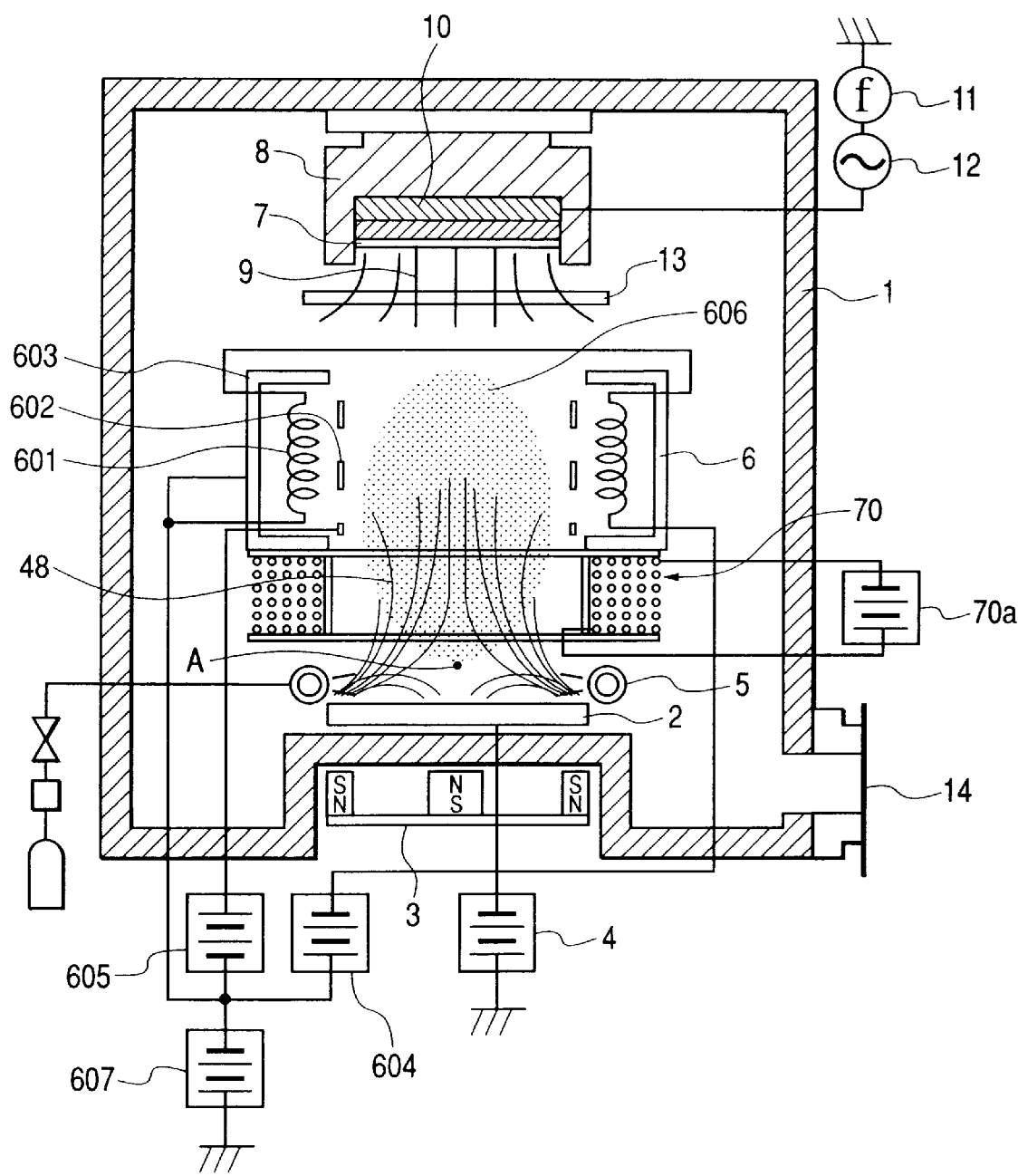
FIG. 9 is a schematic sectional view illustrating the structure of an ionization film-forming apparatus in Example 8 of the present invention.
Figure 10:
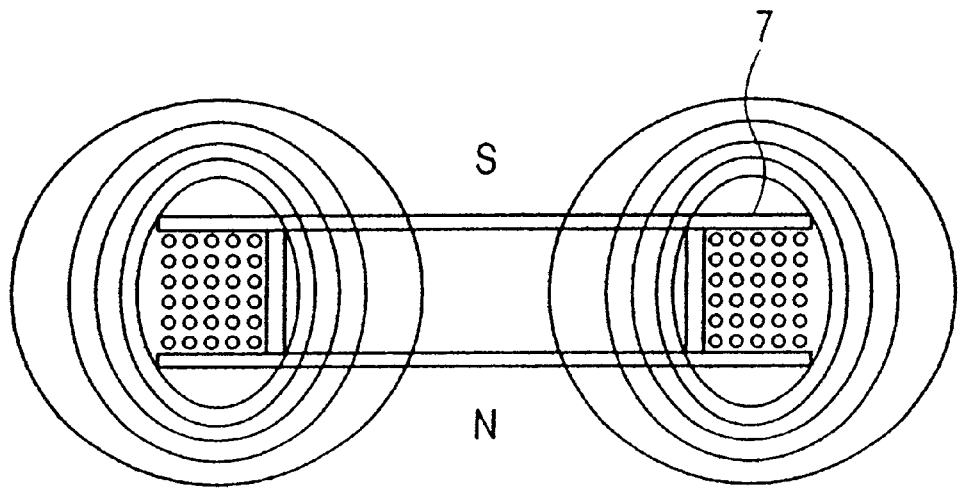
FIG. 10 is a schematic view illustrating magnetic lines of force which are formed when magnetic-field applying means installed in the ionization film-forming apparatus in Example 8 of the present invention is singly used.
Figure 11:
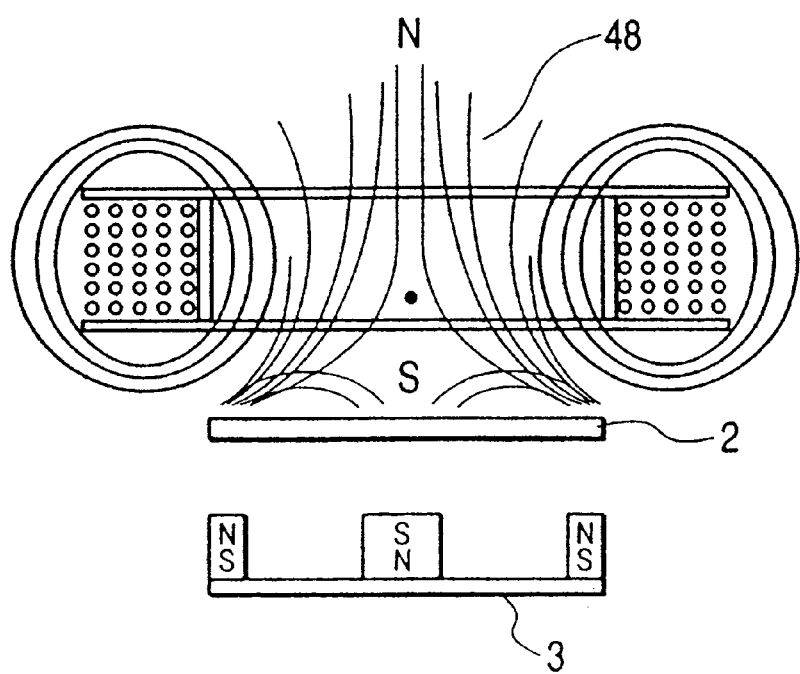
FIG. 11 is a schematic view illustrating magnetic lines of force which are formed by the magnetic-field applying means between a target and an ionizing mechanism and by magnetic-field applying means below the target in FIG. 9.

FIG. 9 is a schematic view showing an ionization film-forming apparatus according to the present example. In the present example, magnetic-field generating means 70 is provided near the ionizing space 606 in the film forming apparatus shown in FIG. 1. The magnetic-field generating means of the present example will be described in detail below. The magnetic-field generating means 70, which is a toroidal electromagnet, is disposed between the target 2 and the ionizing mechanism 6 and secured to the mechanism. Sputtering particles from the target 2 travel through the hole at the center of the magnetic-field generating means 70 to the ionizing space 606 to be ionized, and are deposited on the substrate 7. A magnetic field formed by the magnetic-field generating means 70 provides an N pole on the side of the target 2 and an S pole on the side of the ionizing mechanism 6. A magnetic field formed near the ionizing space 606 is as shown in FIG. 10 so long as no ferromagnetic is near the magnetic-field generating means. In the present example, the magnetic-field generating means 70 and a magnetic mechanism 3 for magnetron sputtering interfere with each other, thereby forming magnetic lines of force 48 as shown in FIG. 11. The present example uses an electromagnet for the magnetic-field generating means 70. However, a permanent magnet which produces the same magnetic field as the electromagnet can be used in place of it.

Figure 12:
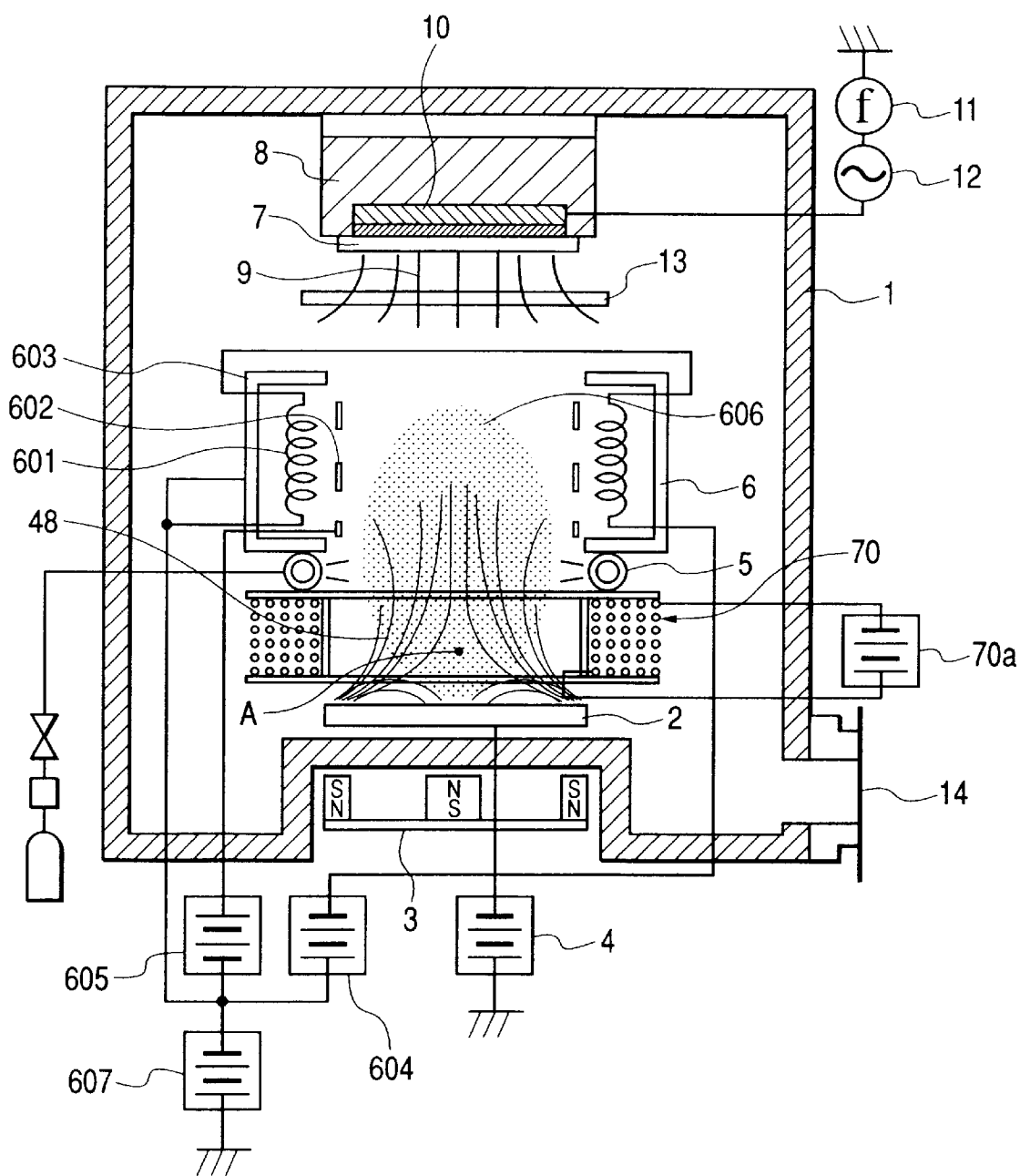
FIG. 12 is a schematic sectional view illustrating the structure of an ionization film-forming apparatus in Example 11 of the present invention.

The magnetic lines of force 48 due to the magnetic-field generating means 70 lead thermoelectrons and sputtering discharge gas ions to the target 2 and increase the speed of film formation on the substrate 7. The magnetic lines of force also maintain the ionizing space because the magnetic field increases ionization efficiency. For example, an ionizing mechanism using plasma causes the magnetic lines of force 48 to condense plasma near the center of the ionizing space and keep plasma in the ionizing space 606 highly dense, so that ionization efficiency can be increased. The magnetic-field generating means 70 is desirably placed in contact with the lower portion of the ionizing mechanism 6 as shown in FIG. 9 or at a distance of 20 to 80 mm from the surface of the target 2 between the ionizing mechanism 6 and the magnetic-field generating means 70 as shown in FIG. 12. It is desirable that the magnetic field be adapted so that a magnetic flux density of about 150 to about 300 G is provided at a distance of about 30 mm from the center of the target toward the substrate. Referring now to FIG. 9, an ionization film-forming method according to the present example will be described below. After the substrate 7 is installed in the substrate holder 8, the sputtering chamber is evacuated to about $5 \times 10^{-5}$ Pa using the complex evacuating system 14. Then the magnetic-field generating means 70 is operated to form the magnetic lines of force 48, and the ionizing mechanism 6 is also operated. That is, an electromagnet power supply 70a is operated and set so that a magnetic flux density of 150 to 300 G is provided at a point A between the target 2 and ionizing mechanism 6. At the same time, the floating DC power supply 607 is operated and set to a value. Moreover, the filament DC power supply 604 is operated to heat the filament 601 by energizing it so that the filament emits thermoelectrons into the ionizing space 606. Then using the processing gas introducing means 5, a sputtering gas such as Ar is introduced, and the evacuation speed adjuster for the complex evacuating system 14 is controlled to adjust the pressure in the sputtering chamber 1. Next, by operating the sputtering power supply 4, sputtering discharge is performed to start sputtering. At the same time, by operating the signal generator 11 and the power amplifier 12, a voltage is applied to the electrode 10 to produce the electric field 9 near the substrate 7. In this case, as the voltage applied to the electrode 10 is, for example, a voltage having the rectangular waveform shown in FIG. 3 is applied to the electrode 10 as described above so that the electrons can be incident on the substrate at the maximum voltage V1 near the floating potential. Specifically, the maximum voltage V1 should be chosen within the range of 0 to −10 V. Depending on conditions, the floating potential may take a small positive value with respect to the ground potential. In this case, V1 should be set near the floating potential. To prevent film formation speed from significantly decreasing under the effect of reverse sputtering, it is desirable that the minimum voltage V2 be set to −20 to −100 V. To make ions efficiently incident on the substrate while preventing substrate charge-up, it is desirable that the frequency be 100 kHz or more and that the waveform duty ratio be set to 1:50 or more, that is, the ratio of the time for which the maximum voltage V1 is applied to the time for which the minimum voltage V2 is applied be set to 1/50 or less. After presputtering is performed for a few minutes, with the conditions unchanged, the substrate shutter 13 is opened to start film formation. Particles sputtered by sputtering discharge are ionized in the ionizing space 606, directed to the substrate, and accelerated under the action of the electric field 9 near the substrate 7, so that the particles are attracted to the substrate 7 substantially at a right angle to the substrate 7 and deposited on the substrate 7. After a film with a predetermined thickness is formed, the shutter 13 is closed, and the signal generator 11, power amplifier 12, sputtering power supply 4, and processing gas introducing means 5 are first stopped and then the filament power supply 604 of the ionizing mechanism 6, grid power supply 605, floating power supply 607 and electromagnet power supply 70a are stopped. Finally, a gate valve not shown is closed, the sputtering chamber 1 is emptied, and the substrate 7 is removed from the substrate holder 8.

Using the above-described film forming apparatus, films were formed under the following conditions:

Material of the target 2: Aluminum

Target dimensions: 76.2 mm in diameter, 3 mm in thickness

Power fed to the target 2: 300 W

Distance between target and substrate: 155 mm

Substrate: Si wafer

Substrate dimension: 76.2 mm in diameter

Film thickness: 200 mm

Pressure in the sputtering chamber: 1.0 Pa

Processing gas: Argon

Processing gas flow rate: 143 sccm

Ionizing mechanism grid voltage: 50 V

Ionizing mechanism grid current: 15 A

Ionizing mechanism floating power supply voltage: −40 V

AC voltage applied to the electrode 10: 0 V (maximum), −30 V (minimum)

Frequency of AC voltage applied to the electrode 10: 500 kHz

Duty ratio of AC voltage applied to the electrode 10: 1:100

Figure 26:
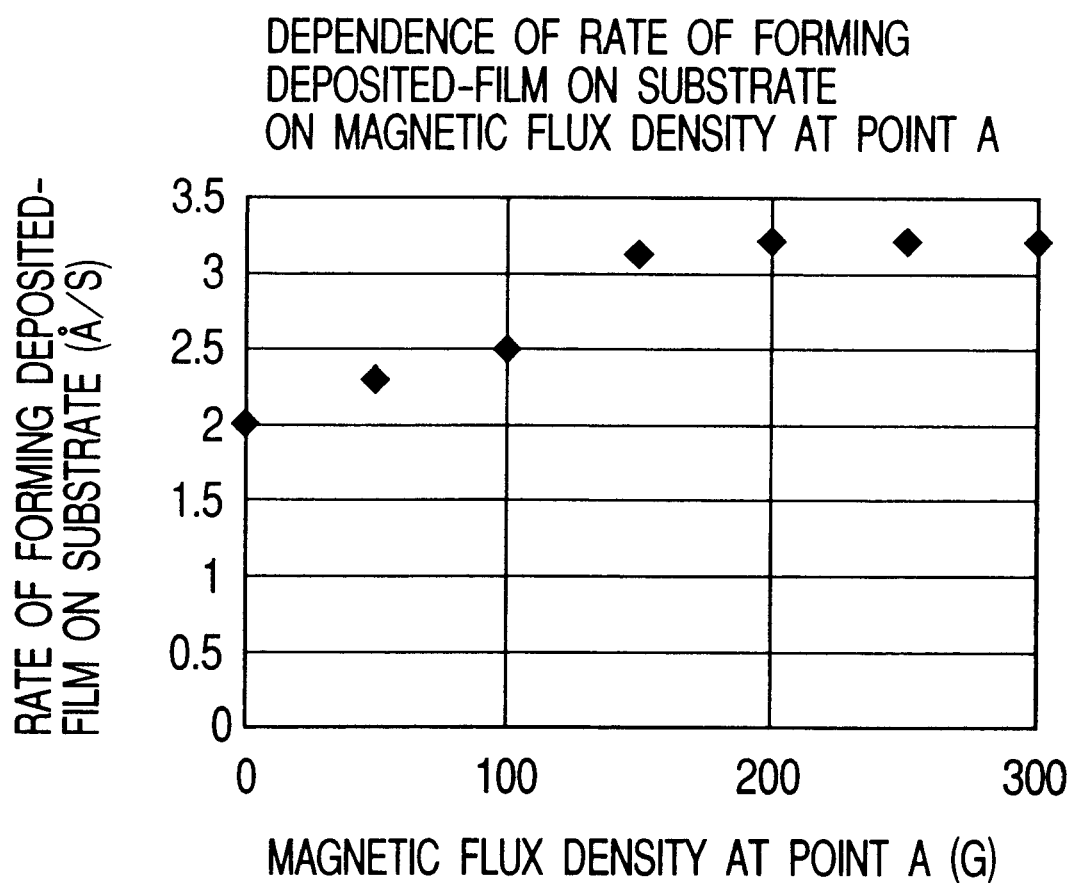
FIG. 26 is a graph for showing the dependency of a magnetic flux density at point A on the rate of forming a deposited film on a substrate.

By varying the output from the electromagnet power supply 70a under the above-described conditions, a magnetic field produced near the ionizing mechanism 6 was changed to form a film. During this film formation, the rate of film formation on the substrate 7 was measured. FIG. 26 shows the results.

In FIG. 26, the abscissa represents the magnetic flux density at the point A between the target 2 and ionizing mechanism 6, and the ordinate represents film formation rate. As shown in FIG. 26, the present example allows setting the magnetic flux density at the point A to a predetermined value to increase film formation rate. For example, when the magnetic flux density at the point A is 150 G, the film formation rate is found to increase by 50% or more, compared with a case where no magnetic field is generated.

EXAMPLE 9

In the present example, the bottom coverage ratio of the deposited film under the conditions in Example 8 was measured. Specifically, a magnetic field generated near the ionizing mechanism 6 was adapted to have a magnetic flux density of 200 G at the point A between the target 2 and ionizing mechanism 6, a film was formed on a sample substrate having grooves with a bottom width of 0.25 μm and an aspect ratio of 4, and then the bottom coverage ratio of deposited film was measured to obtain a good bottom coverage of 40%.

EXAMPLE 10

Under the conditions in Example 9, $SiO_2$ and Al were deposited in that order to a thickness of 100 nm and 200 nm, respectively on an Al substrate, while using $SiO_2$ and Al for the target 2 and DC and RF power supplies as the sputtering power supply. The substrate, which were formed by reactive etching, had grooves with a bottom width of 0.5 μm and an aspect ratio of 4. When dielectric strength was measured between the Al substrate and Al layer to obtain a good dielectric strength of 50V.

EXAMPLE 11

In the present example, the processing gas introducing means 5 was placed immediately above the target 2 between the target 2 and the magnetic-field generating means 70 as shown in FIG. 9 or between the ionizing means 6 and the magnetic-field generating means 70 as shown in FIG. 12. By keeping the amount of Ar gas introduced constant and fixing the conductance valve in the complex evacuating system 14, the pressure P in the sputtering chamber 1 was set to 2 Pa and the staying time τ of argon gas in the sputtering chamber 1 was set to 0.3 sec. Then a film was formed on a substrate having grooves with a bottom width of 0.25 μm and an aspect ratio of 4.

Material of the target 2: Fe

Target dimensions: 76.2 mm in diameter, 3 mm in thickness

Power fed to the target 2: 400 W
Distance between target and substrate: 155 mm
Substrate dimension: 2 inches (50.8 mm) in diameter
Film thickness: 200 nm
Pressure in the sputtering chamber: 1.0 Pa
Sputtering discharge gas: Argon
Magnetic flux density at the point A: 200 G
Ionizing mechanism grid voltage: 50 V
Ionizing mechanism grid current: 20 A
Ionizing mechanism floating power supply voltage: −40 V
Voltage applied to the electrode 10: 0 V (maximum), −60 V (minimum)
Frequency of voltage applied to the electrode 10: 500 kHz
Duty ratio of voltage applied to the electrode 10: 1:100
Magnetic-field strength at the point A: 150 G

COMPARATIVE EXAMPLE 1

Under the same conditions as in Example 11, a film was formed on a sample substrate having grooves with a bottom width of 0.25 $\mu$m and an aspect ratio of 4, except that the processing gas introducing means 5 was placed between the ionizing mechanism 6 and the substrate holder 8.

COMPARATIVE EXAMPLE 2

Under the same conditions as in Example 11, a film was formed on a sample substrate having grooves with a bottom width of 0.25 $\mu$m and an aspect ratio of 4, except of using the processing gas introducing means 5 with such one hole type structure that the gas is blown out through only one hole in place of the circular structure.

COMPARATIVE EXAMPLE 3

Under the same conditions as in Comparative Example 2, a film was formed on a sample substrate having grooves with a bottom width of 0.25 $\mu$m and an aspect ratio of 4, except that the processing gas introducing means 5 was placed at a distance of 10 cm from the outer periphery of the magnetic-field generating means 70.

The bottom coverage ratio was measured at the center of the sample substrates. Table 5 shows the results.

The results show that placing the processing gas introducing means 5 as in the present example, that is, making an arrangement as shown in FIGS. 6 and 9 and providing the means having circular type structure with a plurality of holes increase the bottom coverage ratio, compared with the comparative examples. When a film was formed on a substrate having grooves with a bottom width of 0.25 $\mu$m and an aspect ratio of 4 by a conventional low-pressure remote sputtering method, the bottom coverage ratio was about 16%. This shows that the present example provides a higher bottom coverage ratio, compared with the conventional low-pressure remote sputtering method.

EXAMPLE 12

Under the conditions in Example 11, films were formed, using copper for the target.

COMPARATIVE EXAMPLE

Under the conditions in Comparative Examples 1, 2, and 3 for Example 11, films were formed, using copper for the target. The bottom coverage ratio was measured at the center of sample substrates. Table 6 shows the results.

The results show that placing the processing gas introducing means 5 as in the present example and providing the means having a circular type structure with a plurality of holes increase the bottom coverage ratio similarly as in Example 11.

EXAMPLE 13

Under the conditions in Example 11, films were formed, using TbFeCo as a ternary alloy for the target.

COMPARATIVE EXAMPLE

Under the conditions in Comparative Examples 1, 2, and 3 for Example 11, films were formed, using TbFeCo as a ternary alloy for the target. The bottom coverage ratio was measured at the center of sample substrates. Table 7 shows the results.

The results show that placing the processing gas introducing means 5 as in the present example and providing the means having a circular type structure with a plurality of holes increase the bottom coverage ratio similarly as in Example 11. The results also show that even a material used for magneto-optical recording medium, such as TbFeCo, provides a high bottom coverage ratio.

EXAMPLE 14

Under the conditions in Example 11, films were formed, using $SiO_2$ for the target and an RF power supply as the sputtering power supply 4.

COMPARATIVE EXAMPLE

Under the conditions in Comparative Examples 1, 2, and 3 for Example 11, films were formed, using $SiO_2$ for the target and an RF power supply as the sputtering power supply 4. The bottom coverage ratio was measured at the center of sample substrates. Table 8 shows the results.

The results show that placing the processing gas introducing means 5 as in the present example and providing the means having a circular type structure with a plurality of holes increase the bottom coverage ratio similarly as in Example 11 even when an RF power supply is used as the sputtering power supply.

EXAMPLE 15

Figure 13:
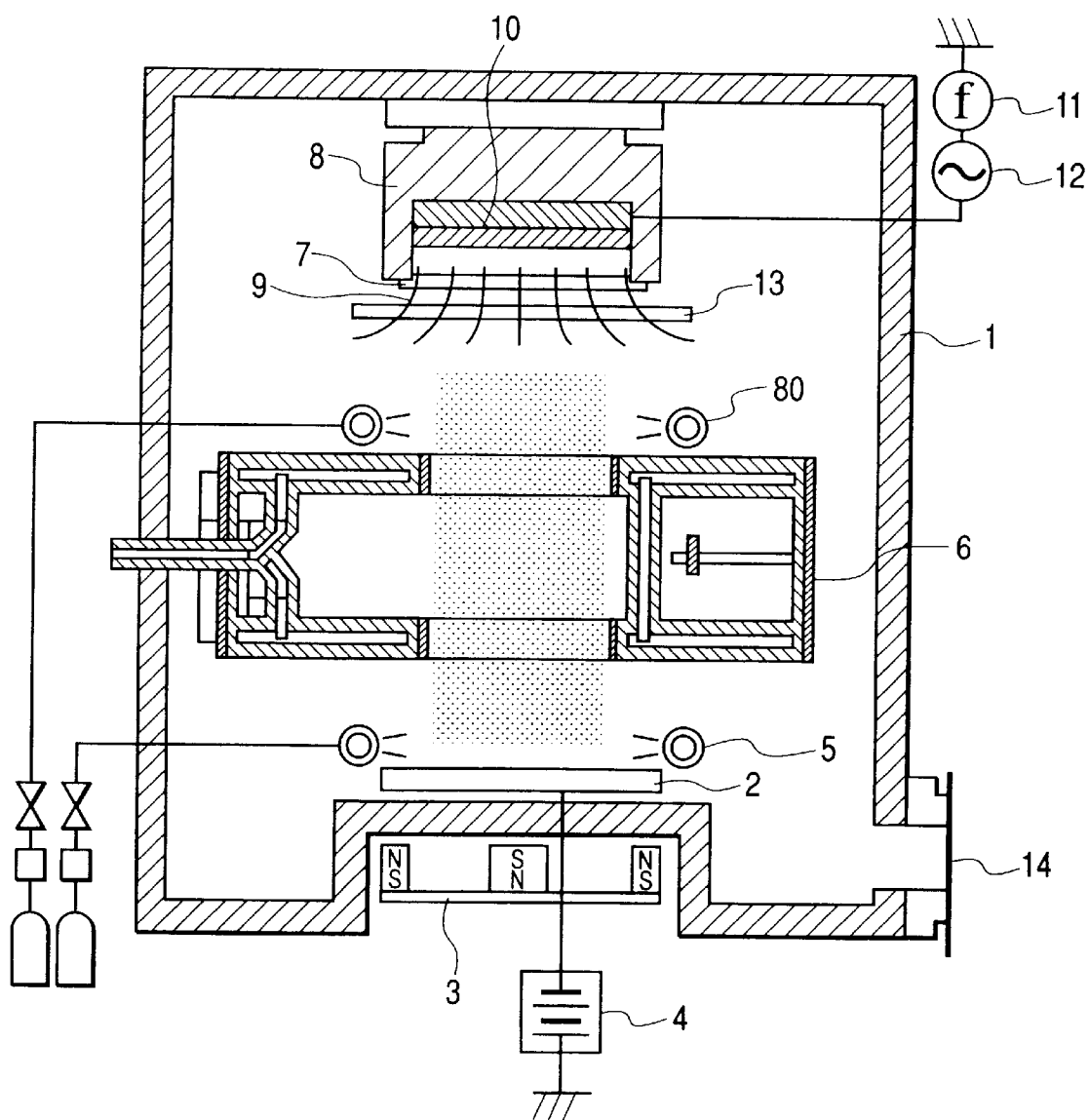
FIG. 13 is a schematic sectional view illustrating the structure of an ionization film-forming apparatus in Example 15 of the present invention.

FIG. 13 is a schematic view of an ionization film-forming apparatus in the present example. The present example is adapted so that a reactive film can be formed by introducing a reactive gas into a chamber, in which reactive gas introducing means 80 is installed. The reactive gas introducing means 80, which introduces a reactive gas such as nitrogen, is structured like the processing gas introducing means 5 and placed so that the gas is uniformly fed to the ionizing space 606. For example, for SiN and $SiO_2$ which are used for a protective film, $N_2$ and $O_2$ are introduced, respectively, and for TiN which is used for a barrier film, $N_2$ is introduced. Material for the target 2 and the type of the reactive gas introduced into the reactive gas introducing means 80 can be changed according to a desired reactive film. The reactive gas is also ionized together with sputtering particles and processing gas particles in the ionizing space 606.

In the present example, using an ionization film-forming apparatus structured as described above, a reactive film (SiNx film) was formed on an Si substrate having grooves with a bottom width of 0.25 $\mu$m and an aspect ratio of 4 and on a flat substrate for five minutes under the following conditions. The bottom coverage ratio and substrate temperature were measured. To generate the electric field 9, a pulse waveform is applied at a maximum-amplitude voltage of 30 V, a maximum applied voltage of 0 V, 500 Hz, and a duty ratio of 1:100.

Material for the target 2: Si
Power fed to the target 2: 300 W
Pressure in the sputtering chamber: 1 Pa
Process gas: Argon
Process gas flow rate: 200 sccm
Reactive gas: $N_2$
Reactive gas flow rate: 60 sccm
Ionizing mechanism grid voltage: 50 V
Ionizing mechanism emission current: 20 A
Ionizing mechanism potential control power supply: Floating

COMPARATIVE EXAMPLE 1

Under the same conditions as in Example 15, a film was formed by feeding a power of 200 W to the electrode 10 at an RF frequency of 13.56 MHz. The bottom coverage ratio was measured.

COMPARATIVE EXAMPLE 2

Under the same conditions as in Example 15, a film was formed without using an ionizing mechanism. The bottom coverage ratio was measured.

Table 9 shows the results. They indicate that the present example significantly increases the bottom coverage ratio, compared with film formation by applying an RF to the electrode 10 or by a conventional sputtering method.

The above is reasoned as follows. If reactive-gas molecules are near the substrate 7, a reduced number of sputtering particles are incident on the substrate at a right angles. This is because some ionized sputtering particles which travel toward the substrate 7 at a right angle to the substrate under the action of the electric field 9 are scattered by reactive-gas particles when colliding with them. Thus the bottom coverage ratio decreases. On the other hand, in the present example, reactive-gas particles are also ionized and incident along the electric field 9 on the substrate 7 to form a reactive film, so that the bottom coverage ratio increases. The present example provides a significantly increased bottom coverage ratio of about 40% while a conventional low-pressure remote sputtering method provides a bottom coverage ratio of about 20%. When an RF is applied to the electrode 10, the substrate reaches a temperature of 200° C. or more. In contrast, the present example provides a significantly reduced substrate temperature of about 50° C. This is almost the same as the substrate temperature in the case with film formation by a conventional sputtering method. The results show that a deposited film can be formed on not only semiconductor substrates but also substrates made of materials with low heat resistance, such as resin widely used for compact disks and magneto-optical disks.

EXAMPLE 16

Under the same conditions as in Example 15, sinusoidal, rectangular, and triangular waves as well as biased sinusoidal, rectangular, pulse, and triangular waves with the maximum applied voltage set to 0V were applied to the electrode to generate the electric field 9 when a film was formed. The rectangular waves applied are three types: rectangular waves 1, 2, and 3. The rectangular wave 1 periodically varies across the ground potential so that the maximum-voltage application time is almost equal to the minimum-voltage application time. The rectangular wave 2 is negative and periodically varies so that the maximum-voltage application time is almost equal to the minimum-voltage application time. The rectangular wave 3 is such that the maximum-voltage application time is 1/100 or less based on the minimum-voltage application time. Films were formed at a maximum-amplitude voltage of 30 V and different frequencies. The bottom coverage ratio and substrate temperature were measured. Table 10 shows the results.

Any waveform and frequency provided a practical bottom coverage ratio. Especially, the rectangular wave 3 and pulse wave allowed a good film to be formed. The rectangular wave 3 and pulse wave controlled substrate temperature to within a practical range, especially at higher frequencies.

EXAMPLE 17

Under the conditions in Example 17, films were formed, with a maximum voltage of 0V applied to the electrode 10 at 500 kHz and different maximum-amplitude voltages. The bottom coverage ratio and substrate temperature were measured. Table 11 shows the results.

Any waveform provided a practical bottom coverage ratio at a maximum-amplitude voltage of 30 to 100 V. Especially, the pulse wave and rectangular wave 3 were remarkably effective at a maximum-amplitude voltage of 30 to 100V. The results show that the pulse wave and rectangular wave 3 can be used for substrates made of materials with low heat resistance, such as resin, because these waves generate a smaller rise in substrate temperature than the others.

EXAMPLE 18

Figure 14:
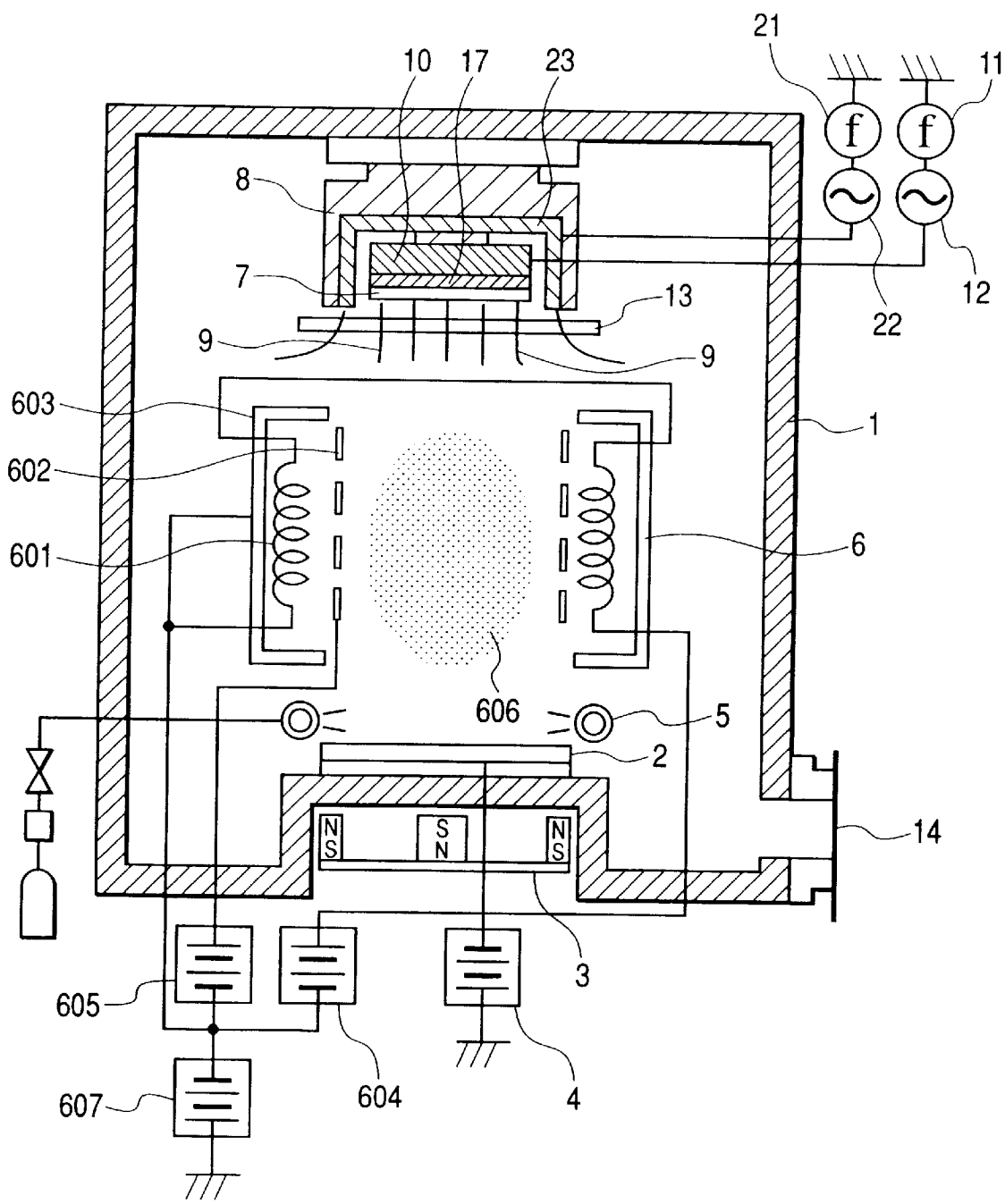
FIG. 14 is a schematic sectional view illustrating the structure of an ionization film-forming apparatus in Example 18 of the present invention.

FIG. 14 is a schematic view of an ionization film-forming apparatus in the present example. The film forming apparatus is the arrangement in FIG. 1, with an auxiliary electrode 23 provided near the substrate 7. The electrode 10, installed on the back side of the substrate 7, has first voltage applying means 11 and 12 for applying a periodically changing voltage to the electrode 10. The auxiliary electrode 23 is intended so that distribution of the electric field 9 at the end of the substrate 7 is the same as at the center of the substrate. The auxiliary electrode 23 is adapted so that the same voltage as applied to the electrode 10 is applied to the auxiliary electrode by second voltage applying means, that is, the function synthesizer 21 and power amplifier 22. A negative DC voltage may be applied to the auxiliary electrode 23. A DC power may be substituted for the function synthesizer 21 and power amplifier 22. The same voltage as applied to the electrode 10, for example, a voltage with the waveform shown in FIG. 3 should be applied to the auxiliary electrode. Using the apparatus in FIG. 14, films were formed under the following conditions:

Target dimension: 76.2 mm in diameter
Dimension of the electrode 10: 76.2 m in diameter
Dimensions of the auxiliary electrode (substrate surface dimensions): 86.2 mm in inner diameter and 96.2 mm in outer diameter
Gap between the electrode 10 and auxiliary electrode: 5 mm
Target material: Aluminum
Power fed to the target: 500 W
Substrate dimension: 76.2 mm in diameter
Pressure in the sputtering chamber: 1.3 Pa Discharge gas: Argon Discharge gas flow rate: 200 sccm Ionizing mechanism grid voltage: 50 V Ionizing mechanism grid current: 20 A (during film formation)

Ionizing mechanism floating power supply voltage: 0 V

Voltage applied to the electrode 10: 0 V (maximum), −30 V (minimum)

Frequency of voltage applied to the electrode 10: 500 kHz

Duty ratio of voltage applied to the electrode 10: 1:100

Frequency of voltage applied to the auxiliary electrode 23: 500 kHz

Duty ratio of voltage applied to the auxiliary electrode 23: 1:100

Under these conditions, films were formed on a substrate having grooves with a bottom width of 0.25 μm and an aspect ratio of 4, with different maximum and minimum voltages V1 and V2 applied to the auxiliary electrode 23. The bottom coverage ratio was measured at the center of the substrate and at a distance of 3 mm from the end of the substrate toward its center. Table 12 gives the results.

For comparison purposes, under the above conditions, films were formed at a ground potential and a floating potential, using the auxiliary electrode 23. Table 12 also gives the results of bottom coverage ratio measurements of the comparative sample.

As shown in Table 12, the results indicate that the present example significantly increase the bottom coverage ratio at the end of the substrate 7. For example, the bottom coverage ratio at a distance of 3 mm from the end of the substrate toward its center was 8% when the auxiliary electrode was at the ground potential and 20% when the auxiliary electrode was at the floating potential. On the other hand, when the maximum V1 and minimum V2 voltages applied to the auxiliary electrode were set to −10 to 0 V and −60 V, respectively, the bottom coverage ratio at a distance of 3 mm from the end of the substrate toward its center was about 40% which is the same as in the center of the substrate. This fact shows that the effective area of the substrate increased. This, in turn, means that a high bottom coverage ratio is provided over the entire surface of a substrate when a next-generation DRAM, a magnetic domain wall displacement type magneto-optical recording medium, etc. are produced.

EXAMPLE 19

By reactive etching, grooves with a bottom width of 0.5 μm and an aspect ratio of 4 were formed in a plurality of sample Al substrates. According to Example 18, using $SiO_2$ for the target and an RF power supply for the sputtering power supply, $SiO_2$ film was formed on the sample Al substrates, with different maximum V1 and minimum V2 voltages applied to the auxiliary electrode 23.

According to Example 18, with different maximum V1 and minimum V2 voltages applied to the auxiliary electrode 23, Al film was formed on the sample Al substrates on which $SiO_2$ film had been formed as described above. The $SiO_2$ film and Al film thus obtained were 20 nm and 300 nm thick, respectively, outside the grooves.

At the bottom of grooves at the center of each sample substrate and at a distance of 3 mm from its end toward its center, dielectric strengths were measured between the aluminum substrate and the aluminum layer formed above it. Table 15 shows the results.

For comparison purposes, Table 13 also shows the measurement results of dielectric strengths in the case of using the auxiliary electrode at a ground potential and a floating potential under the above conditions.

As shown in Table 13, the results show that the present example significantly increase the dielectric strength at the end of the substrate. For example, when a DC voltage of −60 V or a maximum voltage V1 of 0 to −10 V and a minimum voltage of −60 V were applied to the auxiliary electrode 23, a dielectric strength of about 13 V was provided at the end of the substrate which is equal to the dielectric strength at its center.

In the film formation under the conditions of the present example, the floating potential was in a range of 0 to 10 V as described above. From the results of the present example, the maximum voltage V1 was set to a value obtained by subtracting 10 V from the floating potential, thereby obtaining a more suitable result.

EXAMPLE 20

Figure 15:
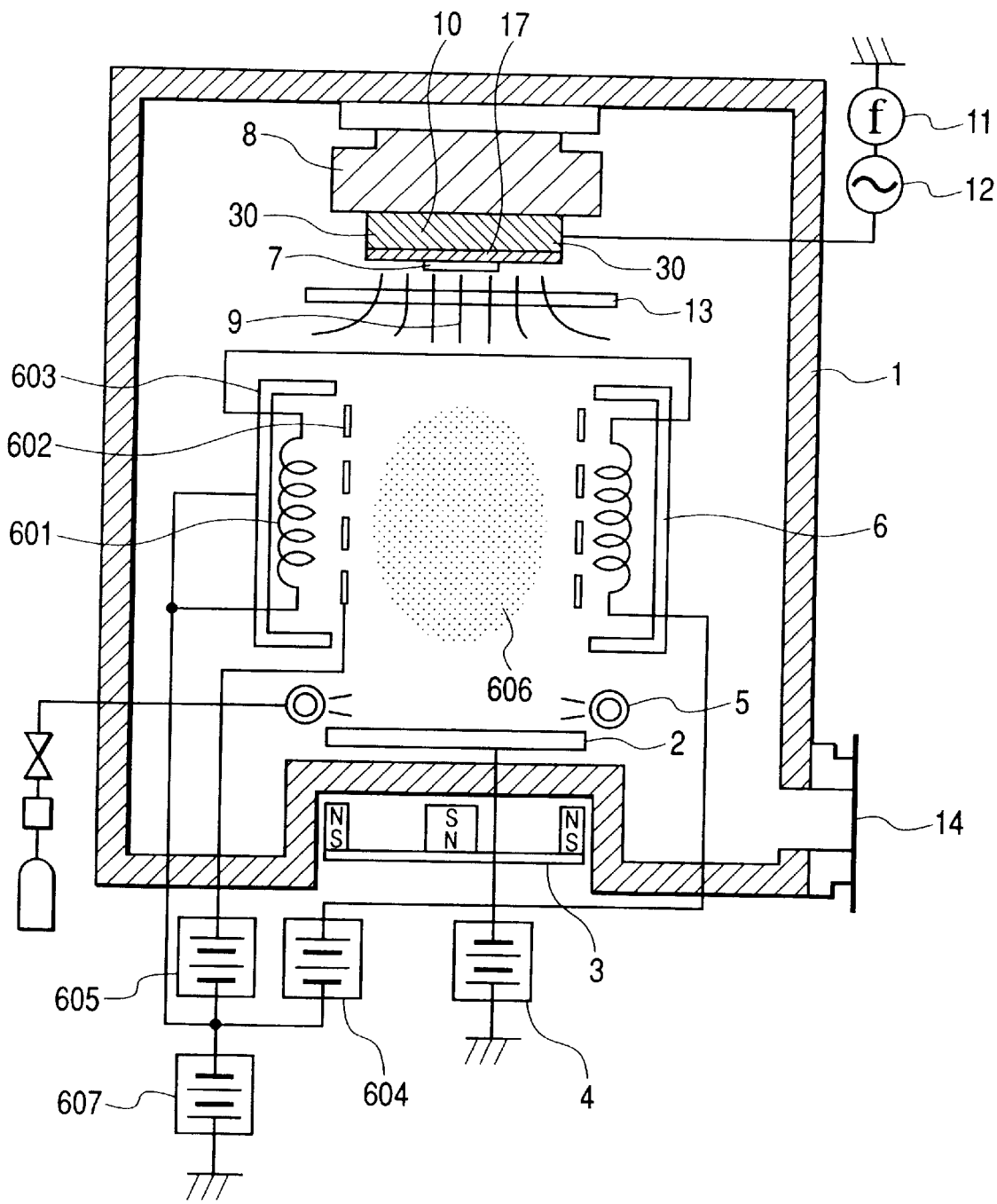
FIG. 15 is a schematic sectional view illustrating the structure of an ionization film-forming apparatus in Example 20 of the present invention.

FIG. 15 is a schematic view of an ionization film-forming apparatus in the present example. The apparatus has the arrangement shown in FIG. 1, provided that the electrode 10 larger than the substrate 7. For example, when the substrate 7 is a disk, the electrode 10 is also a disk which has a larger diameter than the substrate. The electrode 10 extends beyond the end of the substrate 7. The extension 30 of the electrode 10 forms an electric field. This field causes the electric field at the end of the substrate 7 to be perpendicular to its surface, thus making the distribution of the electric field uniform over the entire surface of the substrate 7. Using such an apparatus, film was formed under the following conditions:

Dimension of target 2: 76.2 mm in diameter

Material for the target 2: Aluminum

Power fed to the target 2: 500 W

Pressure in the sputtering chamber: 1.3 Pa

Dimension of the substrate 7: 76.2 mm in diameter

Discharge gas: Argon

Discharge gas flow rate: 200 sccm

Ionizing mechanism grid voltage: 50 V

Ionizing mechanism grid current: 20 A (during film formation)

Ionizing mechanism floating power supply voltage: 0 V

Shape of the electrode 10: Disk

Voltage applied to the electrode 10: 0 V (maximum), −60 V (minimum)

Frequency of voltage applied to the electrode 10: 500 kHz

Duty ratio of voltage applied to the electrode 10: 1:100

Figure 16:
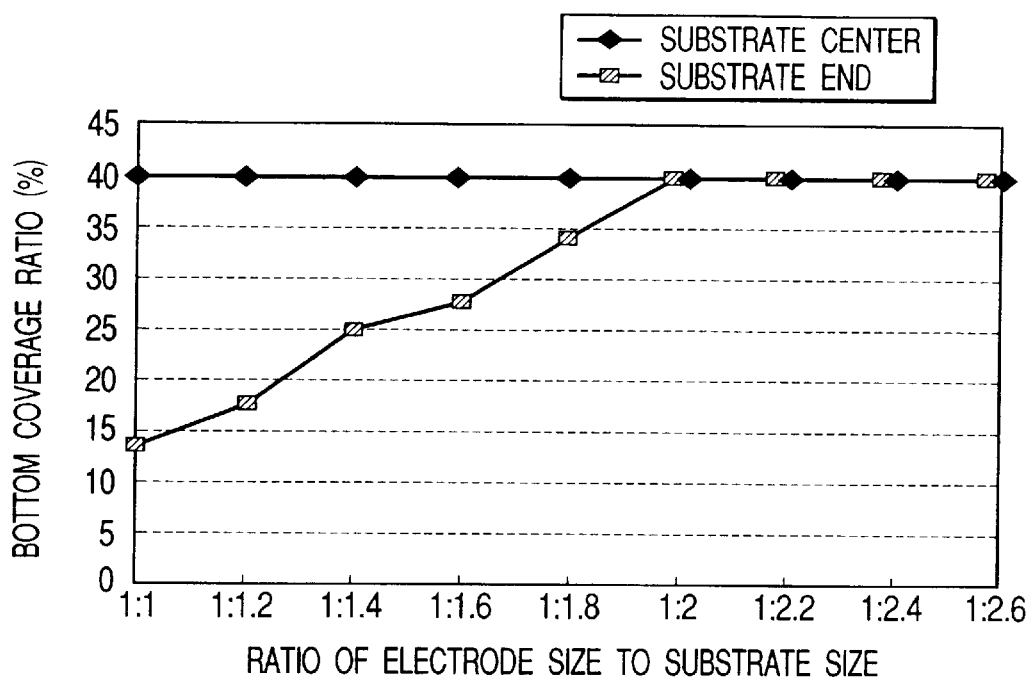
FIG. 16 shows a relationship between the size ratio between a substrate and the electrode 10 and the bottom coverage ratio in Example 20 of the present invention.

Under these conditions, films were formed on a sample substrate having grooves with a bottom width of 0.25 μm and an aspect ratio of 4 at different ratios of the diameter of the electrode 10 to that of the substrate 7 due to different shapes (sizes) of the electrode 10. The bottom coverage ratio was measured at the center of the substrate and at a distance of 3 mm from the end of the substrate toward its center. As shown in FIG. 16, the results show that the present example significantly increases the bottom coverage ratio at the end of the substrate 7. A bottom coverage ratio of about 40% was obtained at a distance of 3 mm from the end of the substrate 7 toward its center which is the same as at the center of the substrate when the electrode 10 had twice the diameter of the substrate 7.

In the film formation under the conditions of the present example, the floating potential was in a range of 0 to 10 V as described above. From the results of the present example, the maximum voltage V1 was set to a value obtained by subtracting 10 V from the floating potential, thereby obtaining a more suitable result.

EXAMPLE 21

Under the conditions in Example 20, $SiO_2$ and Al were used for the target, and an RF power supply was used for the sputtering power supply. By reactive etching, grooves with a bottom width of 0.5 μm and an aspect ratio of 4 were formed in a plurality of sample Al substrates.

$SiO_2$ film and Al film were formed in that order at different ratios of the diameter of the electrode 10 to that of the substrate 7 due to different diameters of the electrode 10. The $SiO_2$ film and Al film were 100 nm and 300 nm, respectively, outside the grooves.

Figure 17:
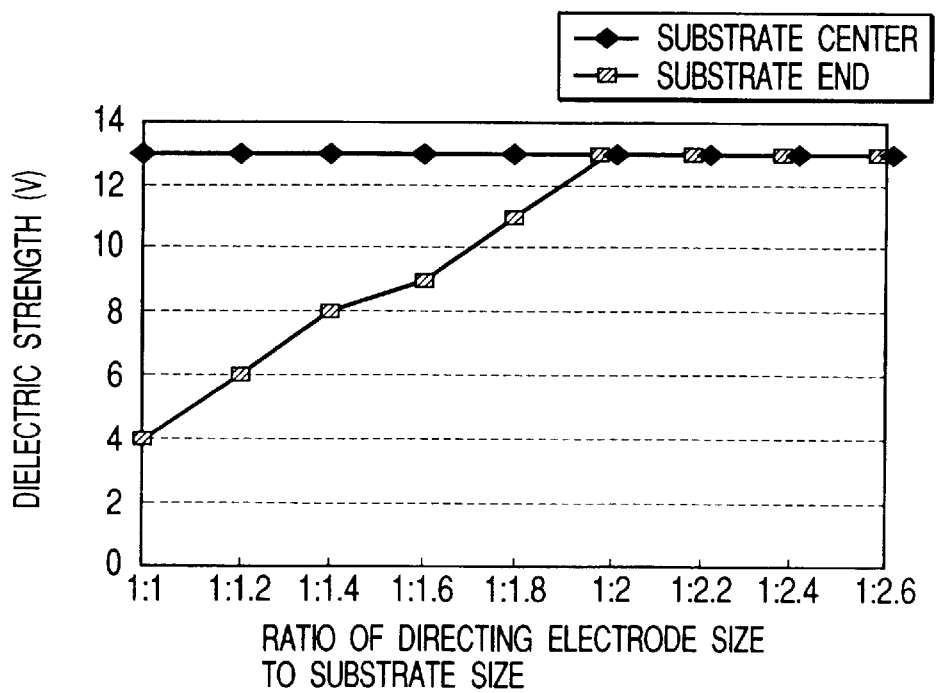
FIG. 17 shows a relationship between the size ratio between a substrate and the electrode 10 and the bottom coverage ratio in Example 21 of the present invention.

At the bottom of grooves at the center of each sample substrate and at a distance of 3 mm from its end toward its center, dielectric strength was measured between the aluminum substrate and the aluminum layer formed above it. FIG. 17 shows the results. They show that the present example significantly increases the dielectric resistance at the end of the substrate 7. A dielectric resistance of about 13 V was obtained at a distance of 3 mm from the end of the substrate 7 toward its center which is the same as the dielectric resistance at the center of the substrate when the diameter of the electrode 10 was twice as large as the diameter of the substrate 7 or its longest diagonal.

EXAMPLE 22

Figure 18:
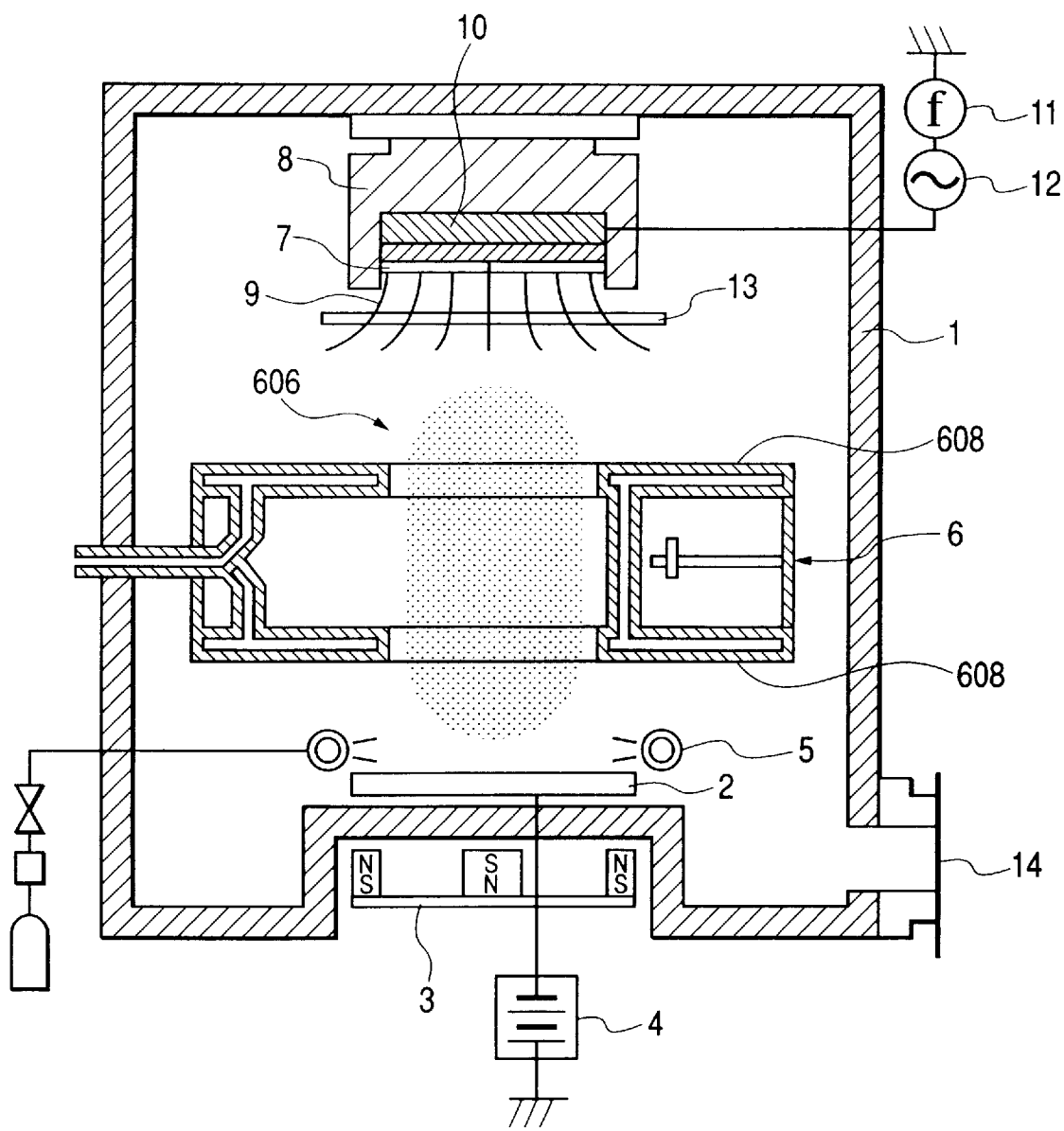
FIG. 18 is a schematic sectional view illustrating the structure of an ionization film-forming apparatus in Example 22 of the present invention.
Figure 19B:
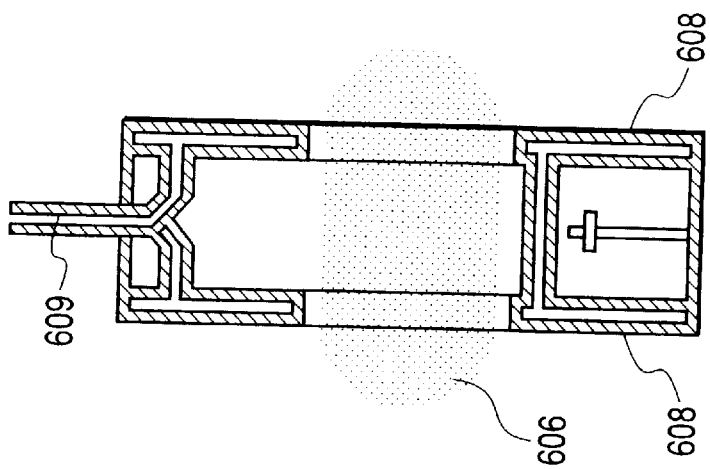
FIGS. 19A and 19B are a top view of ionizing means 6 in an ionization film-forming apparatus in Example 22 of the present invention and a side view of the apparatus, respectively.
Figure 19A:
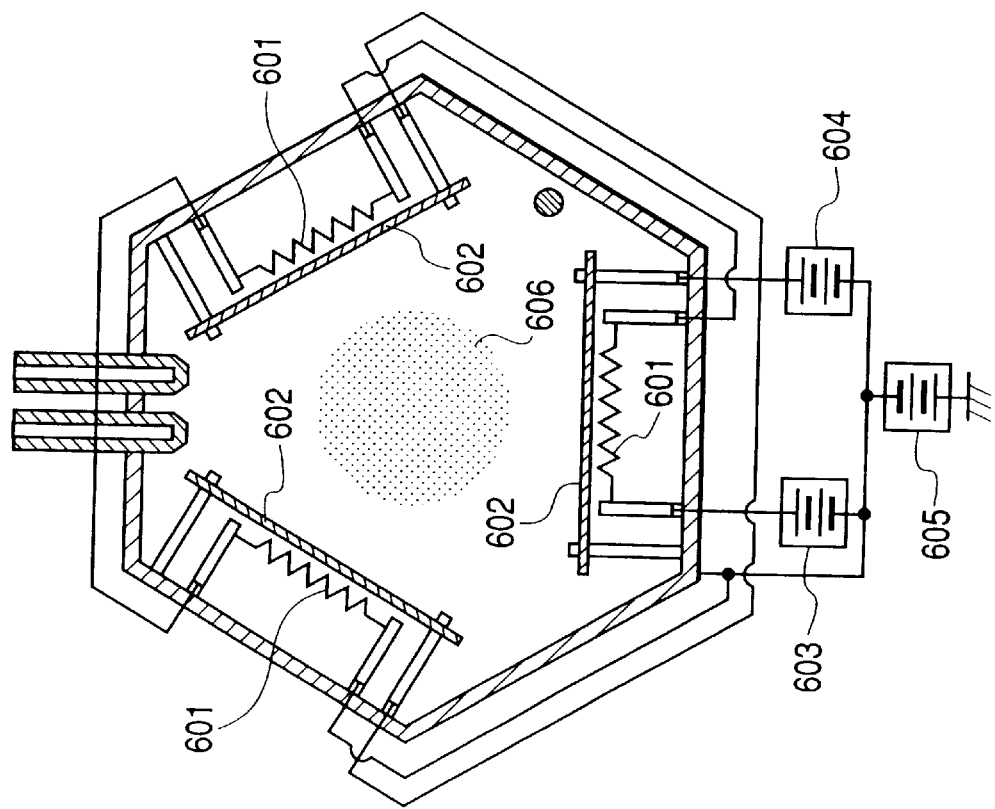
Figure 20:
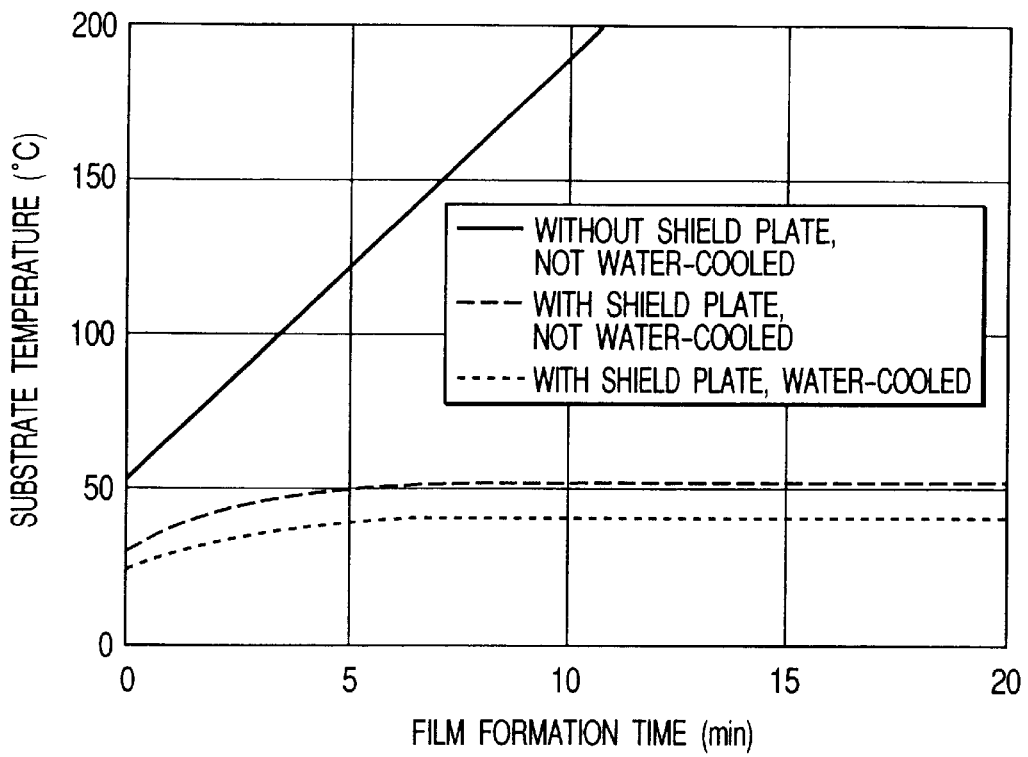
FIG. 20 illustrates relationships between a film forming time and a substrate temperature which are established in cases where a shield plate is provided, the shield plate is cooled, and no shield plate is provided in Example 22 of the present invention.

FIG. 18 is a schematic view of an ionization film-forming apparatus in the present example. The apparatus has the arrangement shown in FIG. 1, provided that the ionizing mechanism 6 provided with a heat shielding mechanism 608. FIGS. 19A and 19B are schematic views of the structure of the ionizing mechanism 6. FIG. 19A and FIG. 19B are a top view and a side view of the ionizing mechanism 6, respectively. The ionizing mechanism 6, which has the filaments 601 connected in series or parallel with each other, and the grid 602, is adapted to feed a current from the filament DC power supply 603 to the filament 601 to heat it, thus making the filament emit thermoelectrons. The grid 602 has a plane grating structure. The apparatus is adapted so that applying a positive voltage from the grid DC power supply 604 to the grid 602 accelerates thermoelectrons from the filament 601 toward the grid 602. The periphery of the ionizing mechanism 6 is cased with the shield plate 608 and a side plate to cover the filament 601 and grid 602 inside. The shield plate 608 is placed so that it does not shut off travel of sputtering particles from the target 2 to the substrate 7 and that heat radiated from the filament 601 and grid 602 does not directly reach the substrate 7. The shield plate 608, which has water-cooling means 609, is designed to prevent an extreme temperature rise due to radiation heat and incoming electrons and heat radiation into the surrounding environment. One side of the filament 601 and the grid 602 are at the same potential as the casing. The casing is normally floating. However, to prevent electron diffusion, a positive DC voltage may be applied to the casing, using the potential control DC power supply 605. The above-described film-forming apparatus was used to form films under the following conditions:

Material for target 2: Aluminum
Power fed to the target 2: 500 W
Pressure in the sputtering chamber: 1.33 Pa
Process gas: Argon process gas flow rate: 200 sccm
Ionizing mechanism grid voltage: 100 V
Ionizing mechanism potential control power supply voltage: Floating
Frequency of AC voltage applied to the electrode 10: 100 kHz FIG. 20 shows the relationship between film formation time and substrate temperature as observed when the shield plate 608 is removed from the ionizing mechanism 6 and when a shield plate, which is not water-cooled, is installed in the mechanism. In the present example, it was examined how substrate temperature changes depending on whether the shield plate 608 installed or not.

As shown in FIG. 20, when the shield plate is removed, the substrate temperature increases with increasing the film formation time, so that the substrate temperature has reached 200° C. when the film formation time exceeds 10 minutes. Although the substrate temperature also increases with increasing the film formation time when a shield plate not water-cooled is installed, a rise in the temperature is small, and the substrate temperature no longer rises after the film formation time exceeds 10 minutes. In addition, the substrate temperature reaches only 50° C. As described above, installing a shield plate makes it possible to significantly reduce the substrate temperature rise. The examination found that the present example allows a film to be formed on a substrate with low heat resistance by high-frequency plasma assisted ionization sputtering and that the present example is effectively applicable to a substrate with low heat resistance.

EXAMPLE 23

In the present example, it was examined how a substrate temperature changes depending on whether the shield plate in the ionizing mechanism is water-cooled or not. FIG. 20 shows the relationship between film formation time and substrate temperature as observed when the shield plate is water-cooled and when it is not water-cooled. The substrate temperature is lower when the shield plate is water-cooled than when it is not water-cooled. In addition, when the shield plate is water-cooled, the substrate temperature no longer rises after the film formation time exceeds 10 minutes. This means that water-cooling the shield plate allows a rise in the substrate temperature to be further reduced. Thus water-cooling the shield plate is found to allow a film to be formed on a substrate which has lower heat resistance, compared with Example 22.

EXAMPLE 24

Figure 21:
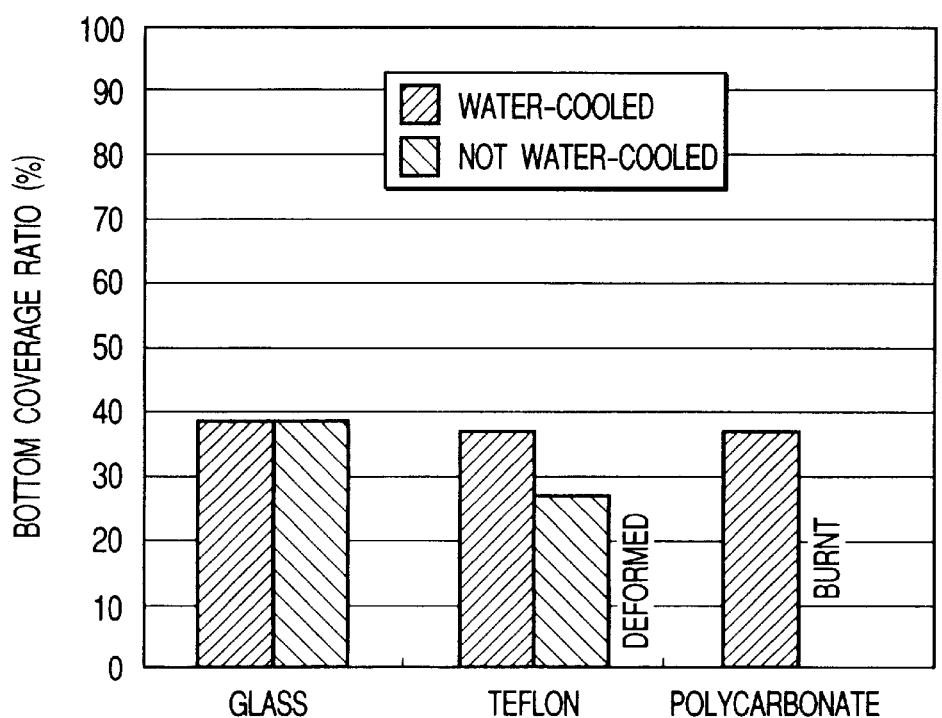
FIG. 21 illustrates differences in the bottom coverage ratio depending on whether shield plates made of glass, Teflon, and polycarbonate are water-cooled or not.

Under the conditions in Example 22, films were formed on three types of substrates having grooves with an aspect ratio of 4. The bottom coverage ratio was measured when a shield plate was installed and when no shield plate was installed. FIG. 21 shows the results. They indicate that films with a high bottom coverage ratio can be formed on a substrate with low heat resistance in the present example. For example, Teflon and polycarbonate substrates deformed or burned when a film was formed on them with no shield plate installed. On the other hand, with a water-cooled shield plate installed, a substrate did not deform, and a high bottom coverage ratio was obtained. In the present example, heat radiation from the filament 601 and grid 602 in the ionizing mechanism 6 toward the substrate 7 could be inhibited, thus minimizing rise in the temperature of the substrate 7 because the shield plate 608 was disposed between the ionizing mechanism 6 and substrate 7 to provide a casing covering the ionizing mechanism 6. Thus a high bottom coverage ratio can be provided, so that a film can securely be formed on a substrate with low heat resistance, on which a film cannot be formed by high-frequency plasma assisted ionization sputtering. This, in turn, means that ionized particles can be deposited in a groove or a hole with a high aspect ratio to form a film with a high bottom coverage ratio when manufacturing a next generation DRAM, magnetic domain wall displacement type magneto-optical disk or the like.

EXAMPLE 25

Figure 22:
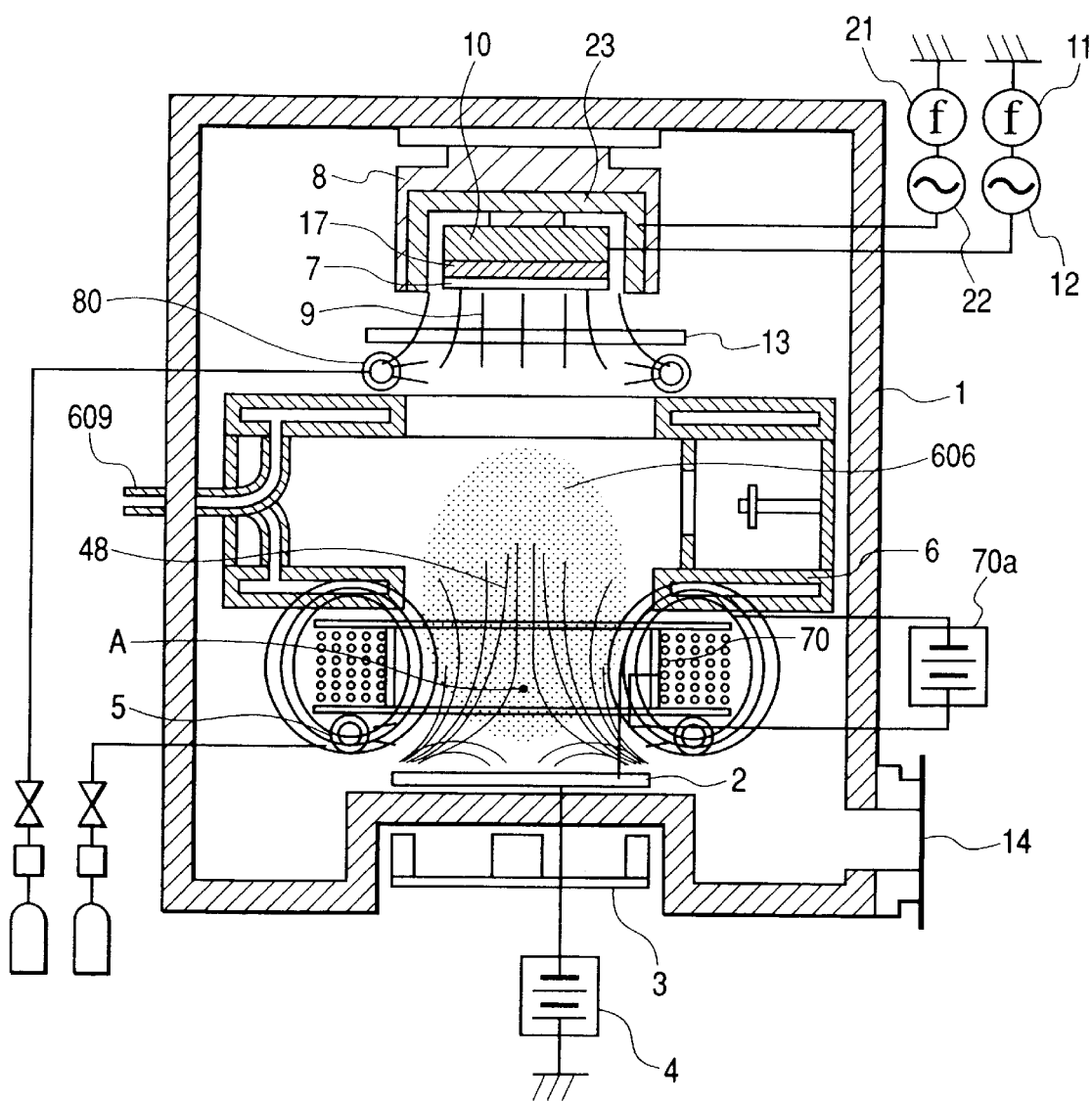
FIG. 22 is a schematic sectional view illustrating the structure of an ionization film-forming apparatus in Example 25 of the present invention.
Figure 23:
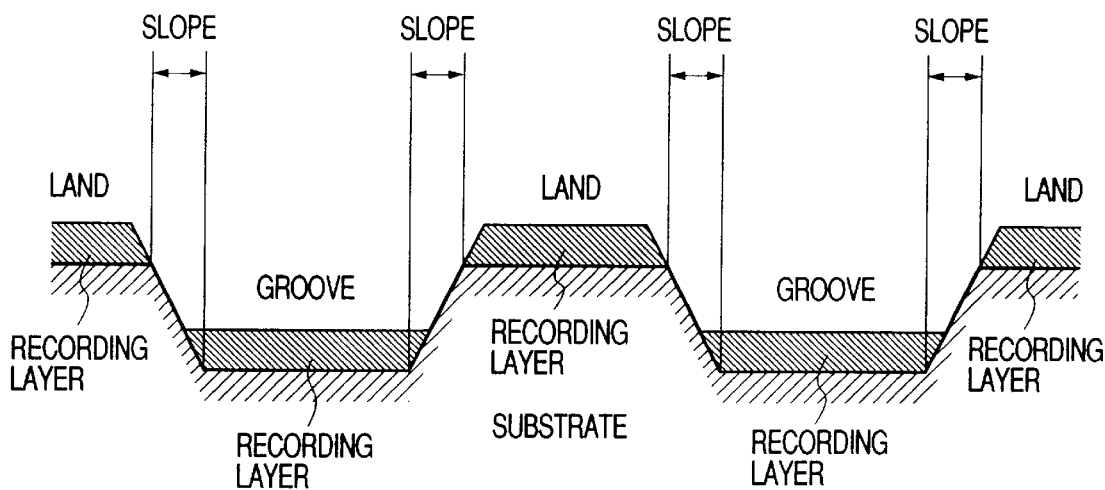
FIG. 23 is a sectional view of a substrate on which a film is formed in Example 25 of the present invention.

FIG. 22 shows the structure of an ionization film-forming apparatus in the present example. The apparatus has the arrangement shown in FIG. 1 further provided with the magnetic-field applying means 7, reactive-gas introducing means 80, auxiliary electrode 23, and heat shielding member 608 for the ionizing means 6. Using the apparatus, films were formed on a magnetic domain wall displacement type recording medium disclosed in Japanese Patent Application No. 6-290496. Magnetic multilayer film, consisting of at least three layers, that is, first, second, and third layers was used for recording. The first magnetic layer consisting of a magnetic film which has lower magnetic-wall coercive force than the third magnetic layer at about ambient temperature, the second magnetic layer consisting of magnetic film which has a lower Curie point than the first and third magnetic layers, and the third magnetic layer consisting of a vertical magnetic film. The apparatus was provided with GdFeCoCr, TbFeCr, and TbFeCoCr alloy targets for forming the first, second, and third magnetic layers, respectively, and with an Si target for forming an SiN film, as an interference layer and a protective layer. FIG. 23 shows the shape of a substrate used for the present example. The substrate was formed as follows. The spacing between grooves and their depth were set to 1.0 $\mu$m and 0.2 $\mu$m, respectively. A flat surface 0.43 $\mu$m wide which was parallel to the surface of the substrate was provided on the lands between the grooves and on the bottom of the grooves. The slope between a land and a groove was inclined about 70% with respect to the surface of the substrate having a diameter of 86 mm. Under the conditions given below, a film was continuously formed on the substrate provided as described above so that a vacuum was not lost.

Target dimensions: 127 mm in diameter, 3 mm in thickness
Power fed to the target 2: 500 W
Distance between the target and substrate: 155 mm
Substrate dimension: 2 inches (50.8 mm) in diameter
Film thickness: 200 nm
Pressure in the sputtering chamber: 1 to 2.5 Pa
Sputtering discharge gas: Argon
Reactive gas: $N_2$ (during SiNx film formation)
Ionizing mechanism grid voltage: 30 V
Ionizing mechanism grid current: 20 A
Ionizing mechanism floating power supply voltage: −30 V
Voltage applied to the electrode 10: 0 V (maximum), −30 V (minimum)
Frequency of voltage applied to the electrode 10: 500 kHz
Duty ratio of voltage applied to the electrode 10: 1:100
Magnetic flux density at the point A: 150 G Film composition and thicknesses are as follows: Substrate/ SiNx, 90 nm/GdFeCoCr, 30 nm/TbFeCr, 10 nm/TbFeCoCr, 80 nm/SiNx, 80 nm; Substrate/interference layer/first magnetic layer/second magnetic layer/third magnetic layer/ protective layer.

The thicknesses given above were measured at the land. By placing 2-mm square chips on the targets, the amount of Co and Cr was adjusted so that the composition of each magnetic layer approximated the compensation composition. The Curie point of the first, second, and third magnetic layers was set to 210° C., 120° C., and about 290° C., respectively. Working pressure was adjusted to be most suitable for each layer. By introducing $N_2$ gas, the SiNx film used for the interference and protective layers was formed using an Si target. To protect the resulting substrate, it was coated with UV-cured resin.

COMPARATIVE EXAMPLE

Figure 24:
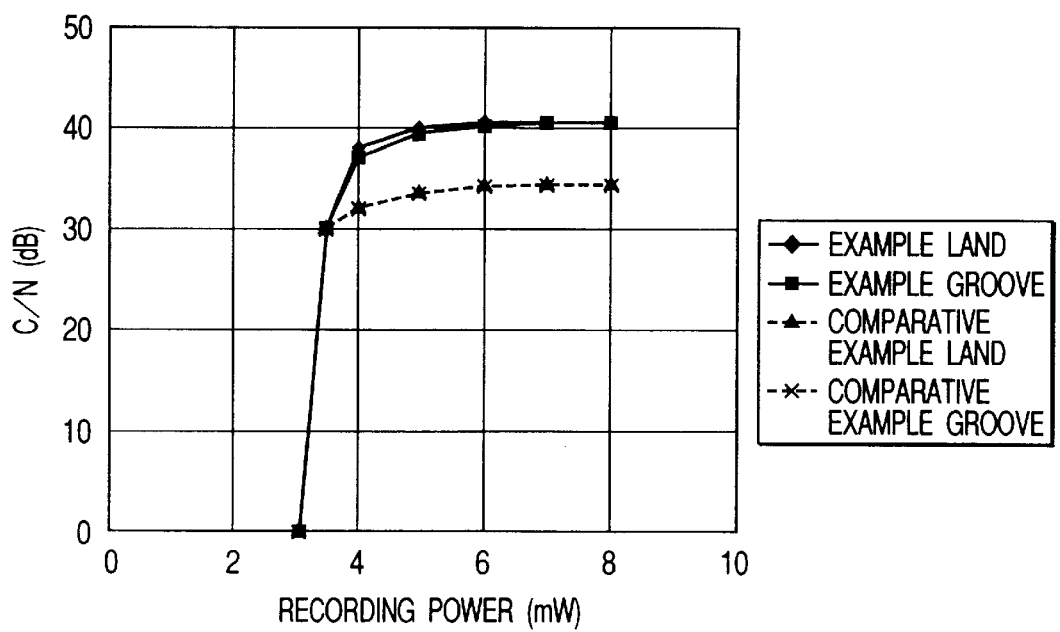
FIG. 24 shows the results of CN ratio measurements using a magnetic domain wall displacement type recording medium in Example 25 of the present invention.
Figure 25:
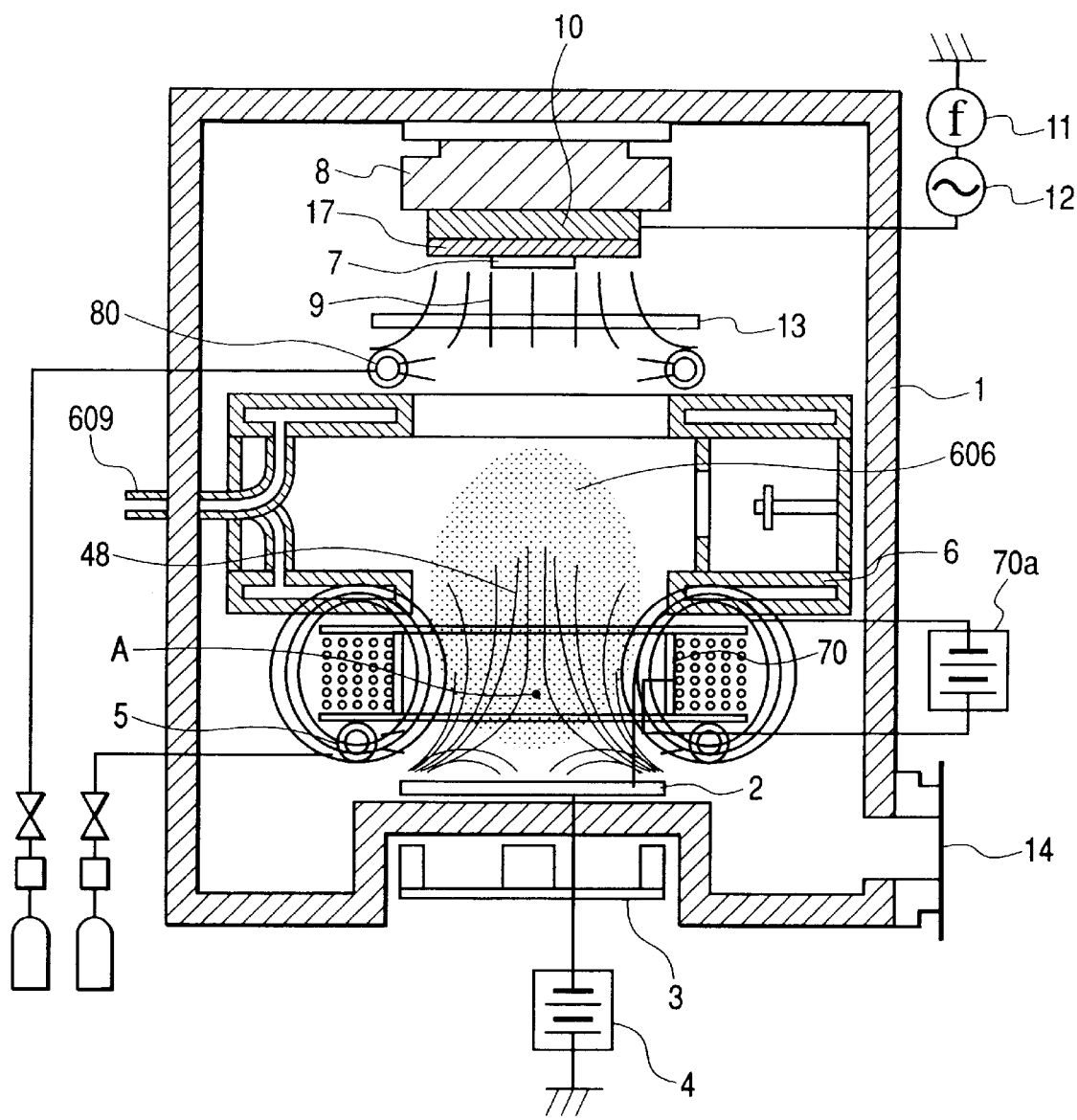
FIG. 25 is a schematic sectional view illustrating another embodiment of the ionization film-forming apparatus in Example 25 of the present invention.

When the ionizing mechanism 6 was not in operation, films were formed by a conventional magnetron sputtering method under the conditions in Example 26, except that a sputtering pressure and a distance between the target and substrate were set to 0.3 Pa and 180 mm. Samples produced in such a manner were installed in a driving apparatus with an optical head which produces laser waves 680 nm in wavelength and with an NA 0.55 objective lens. The samples were rotated at 7.5 Hz to observe recording characteristics at a radius of 31 to 33 mm. While the magnetic field was modulated at 7.5 MHz, using a slide type magnetic head, magnetic-field modulation recording of a pattern 0.1 $\mu$m in mark length was repeatedly performed by irradiating the lands and grooves with a DC laser beam. These recorded signals were reproduced at a reproduction power of 2.5 mW to compare the samples in dependency of the C/N ratio on recording power. An ordinary one-beam optical system was used for evaluation. By heating due to a reproduction beam, a temperature gradient was provided to move a magnetic domain wall. FIG. 24 shows the measurement results. In the present example, the C/N ratio increased by 5 dB or more at a recording power of 4 mW or more for both the lands and grooves, compared with the samples in the comparative example. In addition, if a heated area is formed on a recording track and on the slopes at both its ends by applying a beam at a predetermined or larger recording power, the amount of a film deposited on the slopes is so small that magnetic combination is negligible, and no magnetic domain wall is present on the side walls in a magnetic domain. Thus recording marks can be formed as magnetic domains where magnetic domain walls in the front and rear of the recording track are substantially separated. Because of this, the magnetic domain wall in the recording track could stably be moved in the direction of the track, using the temperature gradient. On the other hand, in the comparative example, if a heated area is formed on a recording track and on the slopes at both its ends, magnetic domain walls are present on the sides of a magnetic domain because magnetic domain walls are also formed on the slopes. Thus recording marks are formed as closed magnetic domains where magnetic domain walls in the front and rear of the recording track are combined together through the magnetic domain walls on the sides of the magnetic domain. Because of this, when the magnetic domain walls in a recording track are moved in the direction of the track by using a temperature gradient, the ease of movement of the magnetic domain wall differs depending on whether the magnetic domain walls are moved in such a direction that the magnetic domain is extended or cut. As a result, the magnetic domain walls cannot stably be moved, noise increases, and the C/N ratio decreases. According to another mode of the present example, as shown in FIG. 25, the extended portion the electrode 10 instead of installing the auxiliary electrode 23 can be provided in the apparatus to obtain a recording medium with the same characteristics.

As described above, the present invention makes it possible to form a film at a high bottom coverage ratio on a substrate having grooves (including continuous recesses and independent recesses, such as holes) with a high aspect ratio while securely inhibiting a rise in substrate temperature.

The present invention also makes it possible to deposit a reactive film which vertically grows well, because the present invention allows reactive-gas particles to be incident on a substrate at a right angle to the substrate. The present invention further makes it possible to provide a film forming method and a film forming apparatus which are preferably used for magnetic domain wall displacement type recording media and the like which require a slope between a land and a groove to have characteristics differing from those of the land and groove.

TABLE 1

Substrate temperature

| $V_1$ (V) | $V_2$ (V) −40 | −60 | −100 |
|---|---|---|---|
| 20 | 180 (° C.) | 182 (° C.) | 179 (° C.) |
| 10 | 179 | 177 | 177 |
| 5 | 160 | 158 | 162 |
| 0 | 60 | 59 | 61 |
| −5 | 56 | 57 | 56 |
| −10 | 53 | 53 | 52 |

TABLE 2

Bottom coverage ratio

| $V_1$ (V) | $V_2$ (V) −10 | −20 | −40 | −80 | −100 | High-frequency plasma assisted ionization | Low-pressure remote sputtering |
|---|---|---|---|---|---|---|---|
| 0 | 11 (%) | 33 (%) | 39 (%) | 38 (%) | 40 (%) | 36 (%) | 16 (%) |
| −5 | 12 | 31 | 40 | 39 | 39 | | |
| −10 | — | 31 | 40 | 40 | 39 | | |
| −20 | — | — | 7 | 8 | 9 | | |
| −40 | — | — | — | 7 | 7 | | |

TABLE 3

Dielectric strength (V)

| $V_1$ (V) | $V_2$ (V) −5 | −10 | −20 | −40 | −60 | −100 | −140 | −180 | Comparative Example |
|---|---|---|---|---|---|---|---|---|---|
| 0 | 2.5 | 2.5 | 10 | 13 | 12 | 12 | 6 | 4 | 2 |
| −10 | — | — | 9 | 13 | 12 | 13 | 7 | 4 | |

TABLE 4

Bottom coverage ratio

| $V_1$ (V) | $V_2$ (V) −10 | −20 | −40 | −60 | −100 |
|---|---|---|---|---|---|
| 0 | 7 (%) | 38 (%) | 33 (%) | 33 (%) | 34 (%) |
| −5 | 8 | 27 | 32 | 33 | 32 |
| −10 | — | 27 | 33 | 33 | 32 |
| −20 | — | — | 7 | 8 | 7 |
| −40 | — | — | — | 7 | 7 |

TABLE 5

| Position of the gas introducing means 5 | Structure of the gas introducing means 5 | Bottom coverage ratio (%) |
|---|---|---|
| Between the ionizing mechanism 6 and magnet mechanism 7 | Circular type | 45 |
| Between the ionizing mechanism 6 and substrate holder 10 | Circular type | 35 |
| Immediately above the target 2 | Circular type | 43 |
| Between the ionizing mechanism 6 and magnet mechanism 7 | One hole type | 37 |
| At distance of 10 cm from the outer periphery of the magnetic-field generating means 7 | One hole type | 28 |

TABLE 6

| Position of the gas introducing means 5 | Structure of the gas introducing means 5 | Bottom coverage ratio (%) |
|---|---|---|
| Between the ionizing mechanism 6 and magnet mechanism 7 | Circular type | 44 |
| Between the ionizing mechanism 6 and substrate holder 10 | Circular type | 33 |
| Immediately above the target 2 | Circular type | 43 |
| Between the ionizing mechanism 6 and magnet mechanism 7 | One hole type | 36 |
| At distance of 10 cm from the outer periphery of the magnetic-field generating means 7 | One hole type | 26 |

TABLE 7

| Position of the gas introducing means 5 | Structure of the gas introducing means 5 | Bottom coverage ratio (%) |
|---|---|---|
| Between the ionizing mechanism 6 and magnet mechanism 7 | Circular type | 46 |

TABLE 7-continued

| Position of the gas introducing means 5 | Structure of the gas introducing means 5 | Bottom coverage ratio (%) |
|---|---|---|
| Between the ionizing mechanism 6 and substrate holder 10 | Circular type | 34 |
| Immediately above the target 2 | Circular type | 44 |
| Between the ionizing mechanism 6 and magnet mechanism 7 | One hole type | 37 |
| At distance of 10 cm from the outer periphery of the magnetic-field generating means 7 | One hole type | 28 |

TABLE 8

| Position of the gas introducing means 5 | Structure of the gas introducing means 5 | Bottom coverage ratio (%) |
|---|---|---|
| Between the ionizing mechanism 6 and magnet mechanism 7 | Circular type | 41 |
| Between the ionizing mechanism 6 and substrate holder 10 | Circular type | 31 |
| Immediately above the target 2 | Circular type | 40 |
| Between the ionizing mechanism 6 and magnet mechanism 7 | One hole type | 33 |
| At distance of 10 cm from the outer periphery of the magnetic-field generating means 7 | One hole type | 25 |

TABLE 9

|  | Present Example | RF13.5 MHz 200 W | Conventional sputtering method |
|---|---|---|---|
| Bottom coverage ratio | 43% | 24% | 15% |
| Substrate temperature | 53° C. | 200° C. or more | 45° C. |

TABLE 10

| | FREQUENCY (Hz) | | | | | |
|---|---|---|---|---|---|---|
| WAVEFORM | 500 | 1 k | 10 k | 100 k | 500 k | 1 M |
| SINUSOIDAL WAVE | Δ/X | Δ/X | Δ/X | Δ/X | Δ/X | Δ/X |
| SINUSOIDAL WAVE | Δ/X | Δ/X | Δ/X | Δ/X | Δ/X | Δ/X |
| RECTANGULAR WAVE 1 | Δ/X | Δ/X | Δ/X | Δ/X | Δ/X | Δ/X |
| RECTANGULAR WAVE 2 | Δ/X | Δ/X | Δ/X | Δ/X | Δ/X | Δ/X |
| RECTANGULAR WAVE 3 | O/Δ | O/Δ | O/Δ | O/O | O/O | O/O |
| PULSE WAVE 3 | O/X | O/X | O/X | O/X | O/Δ | O/Δ |
| TRIANGULAR WAVE | Δ/X | Δ/X | Δ/X | Δ/X | Δ/X | Δ/X |

TABLE 10-continued

| | FREQUENCY (Hz) | | | | | |
|---|---|---|---|---|---|---|
| WAVEFORM | 500 | 1 k | 10 k | 100 k | 500 k | 1 M |
| TRIANGULAR WAVE | Δ/X | Δ/X | Δ/X | Δ/X | Δ/X | Δ/X |

BOTTOM COVERAGE RATIO / SUBSTRATE TEMPERATURE

○: GOOD; BOTTOM COVERAGE RATIO OF 30% OR MORE; AND SUBSTRATE TEMPERATURE OF LESS THAN 70° C.

Δ: PRACTICALLY EFFECTIVE; BOTTOM COVERAGE RATIO EQUAL TO OR MORE THAN 20% AND LESS THAN 30%; AND SUBSTRATE TEMPERATURE EQUAL TO OR MORE THAN 70° C. AND LESS THAN 150° C.

X: NO EFFECTIVE; BOTTOM COVERAGE RATIO LESS THAN 20%; AND SUBSTRATE TEMPERATURE OF 150° C. OR MORE.

NOTE: SUBSTRATE TEMPERATURE IS TEMPERATURE OF RESIN SUBSTRATE.

TABLE 11

| | AMPLITUDE (V) | | | |
|---|---|---|---|---|
| WAVEFORM | 10 | 30 | 60 | 100 |
| SINUSOIDAL WAVE | X/X | Δ/X | Δ/X | Δ/X |
| SINUSOIDAL WAVE | X/Δ | Δ/X | Δ/X | O/X |
| RECTANGULAR WAVE 1 | X/X | Δ/X | Δ/X | Δ/X |
| RECTANGULAR WAVE 2 | X/Δ | Δ/X | O/X | O/X |
| RECTANGULAR WAVE 3 | Δ/O | O/O | O/O | O/O |
| PULSE WAVE 3 | X/O | O/Δ | O/Δ | O/Δ |
| TRIANGULAR WAVE | X/X | Δ/X | Δ/X | Δ/X |
| TRIANGULAR WAVE | X/Δ | Δ/X | O/X | O/X |

BOTTOM COVERAGE RATIO / SUBSTRATE TEMPERATURE

○: GOOD; BOTTOM COVERAGE RATIO OF 30% OR MORE; AND SUBSTRATE TEMPERATURE OF LESS THAN 70° C.

Δ: PRACTICALLY EFFECTIVE; BOTTOM COVERAGE RATIO EQUAL TO OR MORE THAN 20% AND LESS THAN 30%; AND SUBSTRATE TEMPERATURE EQUAL TO OR MORE THAN 70° C. AND LESS THAN 150° C.

X: NO EFFECTIVE; BOTTOM COVERAGE RATIO LESS THAN 20%; AND SUBSTRATE TEMPERATURE OF 150° C. OR MORE.

NOTE: SUBSTRATE TEMPERATURE IS TEMPERATURE OF RESIN SUBSTRATE.

TABLE 12

Bottom coverage ratio (%)

| Minimum voltage V1 (V) | Maximum voltage V2 (V) | | | | | | | | | |
|---|---|---|---|---|---|---|---|---|---|---|
| | 0 | | −10 | | −20 | | −40 | | −60 | |
| | Center | End | Center | End | Center | End | Center | End | Center | End |
| DC voltage | — | — | 38 | 22 | 39 | 33 | 39 | 35 | 39 | 40 |
| 5 | 36 | 7 | 34 | 12 | 35 | 15 | 35 | 25 | 36 | 26 |
| 0 | — | — | 38 | 15 | 38 | 31 | 39 | 35 | 40 | 39 |
| −5 | — | — | 39 | 16 | 39 | 31 | 40 | 35 | 40 | 39 |
| −10 | — | — | — | — | 39 | 31 | 40 | 35 | 40 | 40 |
| −20 | — | — | — | — | — | — | 38 | 22 | 38 | 22 |

| Minimum voltage V1 (V) | Maximum voltage V2 (V) | | | | | | Comparative Example | | | |
|---|---|---|---|---|---|---|---|---|---|---|
| | −100 | | −140 | | −180 | | Ground | | Floating | |
| | Center | End | Center | End | Center | End | Center | End | Center | End |
| DC voltage | 40 | 38 | 38 | 26 | 35 | 16 | 38 | 8 | 39 | 20 |
| 5 | 35 | 29 | 32 | 27 | 29 | 18 | | | | |
| 0 | 39 | 35 | 38 | 27 | 35 | 14 | | | | |
| −5 | 38 | 35 | 38 | 27 | 36 | 16 | | | | |
| −10 | 38 | 34 | 38 | 28 | 36 | 16 | | | | |
| −20 | 38 | 20 | 37 | 19 | 35 | 14 | | | | |

TABLE 13

Dielectric strength (V)

| Minimum voltage V1 (V) | Maximum voltage V2 (V) | | | | | | | | | |
|---|---|---|---|---|---|---|---|---|---|---|
| | 0 | | −10 | | −20 | | −40 | | −60 | |
| | Center | End | Center | End | Center | End | Center | End | Center | End |
| DC voltage | — | — | 13 | 2.5 | 13 | 6 | 13 | 11 | 13 | 13 |
| 5 | 10 | 1 | 11 | 1.5 | 11 | 4 | 10 | 6 | 11 | 8 |
| 0 | — | — | 13 | 2.5 | 12 | 6 | 13 | 11 | 13 | 13 |
| −5 | — | — | 13 | 3 | 12 | 6 | 13 | 11 | 13 | 13 |
| −10 | — | — | — | — | 12 | 6 | 13 | 10 | 13 | 13 |
| −20 | — | — | — | — | — | — | 12 | 11 | 12 | 13 |

| Minimum voltage V1 (V) | Maximum voltage V2 (V) | | | | | | Comparative Example | | | |
|---|---|---|---|---|---|---|---|---|---|---|
| | −100 | | −140 | | −180 | | Ground | | Floating | |
| | Center | End | Center | End | Center | End | Center | End | Center | End |
| DC voltage | 13 | 12 | 12 | 7 | 11 | 7 | 11 | 1 | 12 | 8 |
| 5 | 10 | 9 | 8 | 8 | 8 | 7 | | | | |
| 0 | 13 | 12 | 12 | 7 | 12 | 7 | | | | |
| −5 | 12 | 13 | 12 | 7 | 11 | 7 | | | | |
| −10 | 12 | 12 | 12 | 8 | 12 | 6 | | | | |
| −20 | 12 | 12 | 11 | 6 | 11 | 6 | | | | |

What is claimed is:

1. A method of forming a deposited film by sputtering, comprising the steps of:
   ionizing sputtering particles, and
   applying a periodically changing voltage to an electrode near a substrate,
   wherein a time for applying a maximum value of the periodically changing voltage is shorter than a time for applying a minimum value of the periodically changing voltage, and the maximum value of the periodically changing voltage is 0 or a negative value.

2. The method according to claim 1, wherein the maximum value of the periodically changing voltage is enough to prevent charge-up of the substrate, and the minimum value of the periodically changing voltage is enough to direct the particles to the substrate.

3. The method according to claim 1, wherein the maximum value of the periodically changing voltage ranges from −20 to 0 V.

4. The method according to claim 1, wherein an amplitude of the periodically changing voltage applied to the electrode disposed near the substrate ranges from 0 to −100V.

5. The method according to claim 1, wherein the voltage applied to the electrode periodically changes at a frequency of 100 kHz or more.

6. The method according to claim 1, wherein the voltage applied to the electrode has a rectangular waveform, and a ratio of the time for applying the maximum voltage to the time for applying the minimum voltage is 1/50 or less.

7. The method according to claim 1, wherein the ionization is carried out by means of a hot cathode.

8. The method according to claim 7, wherein thermoelectrons produced in an ionization space are led to a target by a magnetic field.

9. The method according to claim 1, further comprising a step of generating a magnetic field near an ionization space in which the ionization is performed.

10. The method according to claim 9, wherein a magnetic-field direction includes at least a component in a direction of a straight line connecting the target and the substrate.

11. The method according to claim 1, further comprising a step of ionizing reactive gas particles in an ionization space.

12. The method according to claim 1, further comprising a step of applying the same voltage as applied to the electrode near the substrate or a negative constant voltage to an auxiliary electrode disposed near the substrate.

13. The method according to claim 12, wherein the voltage applied to the electrode and auxiliary electrode near the substrate ranges from 0 to −100 V.

14. The method according to claim 12, wherein the voltage applied to the electrode and auxiliary electrode near the substrate periodically changes at a frequency of 100 kHz or more.

15. The method according to claim 12, wherein the voltage applied to the electrode and auxiliary electrode near the substrate has a rectangular waveform, and the ratio of the time for applying the maximum voltage to the time for applying the minimum voltage is 1/50 or less.

16. The method according to claim 12, wherein the ionization is carried out by means of a hot cathode.

17. The method according to claim 1, wherein the electrode near the substrate has an extended portion in a periphery of the substrate.

18. The method according to claim 17, wherein the voltage applied to the electrode near the substrate ranges from 0 to −100 V.

19. The method according to claim 17, wherein the voltage applied to the electrode near the substrate periodically changes at a frequency of 100 kHz or more.

20. The method according to claim 17, wherein the voltage applied to the electrode has a rectangular waveform, and the ratio of the time for applying the maximum voltage to the time for applying the minimum voltage is 1/50 or less.

21. The method according to claim 17, wherein the ionization is carried out by means of a hot cathode.

22. The method according to claim 1, further comprising a step of shielding radiation of heat generated during the ionization toward the substrate.

23. The method according to claim 22, wherein the shielding of the heat radiation is carried by a shield structure member.

24. The method according to claim 23, further comprising a step of cooling the shield structure member.

25. The method according to claim 23, further comprising a step of applying a predetermined voltage to the shield structure member.

26. The method according to claim 22, wherein the shielding of the heat radiation is carried out in an area excluding travel paths of the ionized particles.

27. A method of forming a deposited film by sputtering, comprising the steps of:

ionizing sputtering particles; and applying a periodically changing voltage to an electrode near a substrate, wherein a maximum value of the periodically changing voltage is equal to or more than a value obtained by subtracting 10 V from a floating potential.

28. A method of forming a deposited film by sputtering, comprising the steps of:

ionizing sputtering particles, and applying a periodically changing voltage to an electrode near a substrate, wherein a maximum value of the periodically changing voltage approximates to a floating potential.

29. An ionization sputtering apparatus in which a deposited film is formed by directing sputtering particles to a substrate, comprising:

a sputtering chamber with an evacuating system;

gas introducing means for introducing a processing gas into the sputtering chamber;

a target placed in the sputtering chamber;

ionizing means provided between the target and the substrate;

an electrode disposed near the substrate; and voltage applying means for applying to the electrode a periodically changing voltage such that a time for applying a voltage equal to or higher than an intermediate value between maximum and minimum values of the periodically changing voltage is applied is shorter than a time for applying a voltage equal to or less than the intermediate value.

30. The apparatus according to claim 29, wherein the ionizing means is a hot cathode.

31. The apparatus according to claim 30, further comprising magnetic-field generating means disposed near the ionizing means.

32. The apparatus according to claim 31, wherein directions of magnetic lines of force formed by the magnetic field include at least a component in a direction of a line connecting the target and the substrate.

33. The apparatus according to claim 31, wherein the magnetic-field generating means comprises:

a first magnet provided between the target and the ionizing means, and a second magnet provided opposite to the substrate with respect to the target.

34. The apparatus according to claim 33, further comprising means for exciting the processing gas which is introduced from the gas introducing means by electrons led to the side of the target.

35. The apparatus according to claim 31, wherein a magnetic flux density at a distance of 30 mm from the center of the target toward the substrate ranges from 150 to 300 G.

36. The apparatus according to claim 31, wherein the gas introducing means is provided between the target and a magnetic-field applying means or between the magnetic-field applying means and the ionizing means.

37. The apparatus according to claim 29, further comprising an auxiliary electrode provided around the substrate.

38. The apparatus according to claim 37, further comprising:

first voltage applying means for applying the periodically changing voltage to the electrode near the substrate such that the time for applying a voltage equal to or higher than the intermediate value between maximum and minimum values of the periodically changing voltage is shorter than the time for applying a voltage equal to or less than the intermediate value, and second voltage applying means for applying to the auxiliary electrode the same voltage as applied to the electrode near the substrate or a negative constant voltage.

39. The apparatus according to claim 37, wherein the ionizing means is a hot cathode.

40. The apparatus according to claim 29, wherein the gas introducing means is a cylindrical pipe having a plurality of gas blow-out holes provided on a center side thereof, and wherein the gas introducing means is provided to surround the center of an ionization space formed by the ionizing means.

41. The apparatus according to claim 29, further comprising a heat shielding structure for preventing heat radiated during film formation from directly reaching the substrate.

42. The apparatus according to claim 41, wherein the ionizing means is a hot cathode.

43. The apparatus according to claim 41, wherein the heat shielding structure is provided between the ionizing means and the substrate.

44. The apparatus according to claim 43, wherein the heat shielding structure is provided so that travel paths of the ionized particles going from the target to the substrate are kept intact.

45. The apparatus according to claim 41, further comprising cooling means for cooling the shield structure.

46. The apparatus according to claim 45, wherein the cooling means is a water-cooling means.

47. The apparatus according to claim 29, wherein the electrode near the substrate has an extended portion in a periphery of the substrate.

48. The apparatus according to claim 47, wherein the ionizing means is a hot cathode.

49. A method of forming a deposited film by sputtering, comprising the steps of:

ionizing sputtering particles, and applying a periodically changing voltage to an electrode near a substrate, wherein a time for applying a voltage equal to or higher than an intermediate value between maximum and minimum values of the periodically changing voltage is shorter than a time for applying a voltage less than the intermediate value or wherein a time for applying a voltage higher than the intermediate value between maximum and minimum values of the periodically changing voltage is shorter than a time for applying a voltage equal to or less than the intermediate value, and the maximum value of the periodically changing voltage is 0 or a negative value.

* * * * *

UNITED STATES PATENT AND TRADEMARK OFFICE
CERTIFICATE OF CORRECTION

PATENT NO.    : 6,551,471 B1
DATED         : April 22, 2003
INVENTOR(S)   : Hirohito Yamaguchi et al.

It is certified that error appears in the above-identified patent and that said Letters Patent is hereby corrected as shown below:

Title page,
Item [56], References Cited, FOREIGN PATENT DOCUMENTS,
"JP 6290496" should read -- JP 6-290496 --; and "JP 10259480" should read
-- JP 10-259480 --.

Item [75], Inventors, "Kawasaki" (both occurrences) should read -- Kanagawa Ken --.

Column 1,
Line 44, "interferences" should read -- interference --;
Line 45, "lands, to" should read -- lands. To --; and
Line 50, "ration" should read -- ratio --.

Column 2,
Line 10, "deposite" should read -- deposit --; and
Line 55, "and applying" should read -- and ¶ applying --.

Column 3,
Line 36, "Ti" should read -- T1 --.

Column 4,
Line 58, "valve" should read -- valve, --.

Column 5,
Line 4, "imagnetron" should read -- magnetron --;
Line 28, "ionizing;" should read -- ionizing --;
Line 36, "travels" should read -- travel --;
Line 37, "602 the" should read -- 602 into the --;
Line 66, "V2(a" should read -- V2 (a --; and
Line 67, "maximum" should read -- a maximum --.

Column 6,
Line 26, "+10" should read -- +10V --.

Column 7,
Line 15, "not shown" should read -- (not shown) --.

UNITED STATES PATENT AND TRADEMARK OFFICE
CERTIFICATE OF CORRECTION

PATENT NO. : 6,551,471 B1
DATED : April 22, 2003
INVENTOR(S) : Hirohito Yamaguchi et al.

It is certified that error appears in the above-identified patent and that said Letters Patent is hereby corrected as shown below:

Column 8,
Line 46, "voltaged" should read -- voltage --; and
Line 48, "were" should read -- was --.

Column 9,
Line 2, "Ti" should read -- T1 --;
Line 7, "were" should read -- was --; and
Line 64, "measured" should read -- measured. --.

Column 10,
Line 7, "SiN." should read -- $SiN_x$ --; and
Line 12, "were" should read -- was --.

Column 11,
Line 52, "not shown" should read -- (not shown) --.

Column 12,
Line 45, "were" should read -- was --; and
Line 47, "When" should read -- Then --.

Column 13,
Line 31, "except of" should read -- except in --;
Line 33, "that" should read -- so that --; and
Line 49, "increase" should read -- increases --.

Column 14,
Lines 4, 21 and 41, "increase" should read -- increases --;

Column 15,
Line 36, "spat-" should read -- sput- --; and
Line 37, "angles." should read -- angle. --.

Column 17,
Line 29, "increase" should read -- increases --.

UNITED STATES PATENT AND TRADEMARK OFFICE
CERTIFICATE OF CORRECTION

PATENT NO.     : 6,551,471 B1
DATED          : April 22, 2003
INVENTOR(S)    : Hirohito Yamaguchi et al.

It is certified that error appears in the above-identified patent and that said Letters Patent is hereby corrected as shown below:

Column 18,
Line 4, "increase" should read -- increases --; and
Line 22, "larger" should read -- is larger --.

Column 19,
Line 34, "provided" should read -- is provided --.

Column 20,
Line 13, "installed" should read -- is installed --.

Column 21,
Lines 22, 25 and 27, "consisting" should read -- consisted --;

Column 22,
Line 64, "the extended portion the electrode 10" should read -- an extended portion of the electrode 10 is provided --; and
Line 66, delete "can be provided".

Column 25,
Table 10, "PULSE WAVE 3" should read -- PULSE WAVE --.

Column 26,
Table 10, "X NO EFFECTIVE" should read -- X NOT EFFECTIVE --;
Table 11, "PULSE WAVE 3" should read -- PULSE WAVE --; and
Table 11, "X NO EFFECTIVE" should read -- X NOT EFFECTIVE --.

Signed and Sealed this

Eighteenth Day of November, 2003

JAMES E. ROGAN
*Director of the United States Patent and Trademark Office*